(12) United States Patent
Park

(10) Patent No.: US 11,837,576 B2
(45) Date of Patent: Dec. 5, 2023

(54) MEMORY CARD

(71) Applicant: SAMSUNG ELECTRONICS CO., LTD., Suwon-si (KR)

(72) Inventor: Youngwoo Park, Cheonan-si (KR)

(73) Assignee: Samsung Electronics Co., Ltd.

( * ) Notice: Subject to any disclaimer, the term of this patent is extended or adjusted under 35 U.S.C. 154(b) by 140 days.

(21) Appl. No.: 17/377,865

(22) Filed: Jul. 16, 2021

(65) Prior Publication Data

US 2022/0189915 A1 Jun. 16, 2022

(30) Foreign Application Priority Data

Dec. 15, 2020 (KR) .................... 10-2020-0175829

(51) Int. Cl.
| | |
|---|---|
| *H01L 25/065* | (2023.01) |
| *H01L 23/00* | (2006.01) |
| *G11C 11/56* | (2006.01) |
| *G06K 19/077* | (2006.01) |

(52) U.S. Cl.
CPC ...... *H01L 25/0652* (2013.01); *G11C 11/5671* (2013.01); *H01L 24/32* (2013.01); *H01L 24/48* (2013.01); *H01L 24/73* (2013.01); *G06K 19/07732* (2013.01); *H01L 2224/32145* (2013.01); *H01L 2224/48137* (2013.01); *H01L 2224/48145* (2013.01); *H01L 2224/48225* (2013.01); *H01L 2224/73265* (2013.01); *H01L 2225/0651* (2013.01); *H01L 2225/06506* (2013.01); *H01L 2225/06562* (2013.01); *H01L 2924/1432* (2013.01); *H01L 2924/1438* (2013.01); *H01L 2924/182* (2013.01)

(58) Field of Classification Search
CPC ..... H01L 25/0652; H01L 24/32; H01L 24/48; H01L 24/73; G11C 11/5671
USPC ....................................................... 257/690
See application file for complete search history.

(56) References Cited

U.S. PATENT DOCUMENTS

| | | | |
|---|---|---|---|
| 7,687,921 | B2 | 3/2010 | Hiew et al. |
| 7,732,908 | B2 | 6/2010 | Nishiyama et al. |
| 8,643,175 | B2 | 2/2014 | Kim et al. |
| 9,230,942 | B2 | 1/2016 | Kumar et al. |
| 10,002,853 | B2 | 6/2018 | Oh |
| 10,262,972 | B2 | 4/2019 | Lee et al. |
| 10,482,935 | B2 | 11/2019 | Park et al. |
| 10,761,969 | B2 | 9/2020 | Jung et al. |
| 2004/0215996 | A1 | 10/2004 | Kanamori et al. |
| 2008/0003883 | A1* | 1/2008 | Ni ......................... H05K 1/117 439/83 |
| 2009/0287879 | A1 | 11/2009 | Oh et al. |
| 2022/0320065 | A1* | 10/2022 | Sanuki .................. H01L 24/16 |

* cited by examiner

*Primary Examiner* — Jasmine J Clark
(74) *Attorney, Agent, or Firm* — Myers Bigel, P.A.

(57) ABSTRACT

A memory card includes an upper case, a lower case, and an integrated circuit package between the upper case and the lower case. The integrated circuit package includes a memory stacked chip on a panel substrate, and the memory stacked chip includes a base memory stacked chip and an additional memory stacked chip stacked on the base memory stacked chip. The integrated circuit package includes a frequency boosting interface chip on the panel substrate and electrically connected to the memory stacked chip, and a controller chip on the panel substrate and electrically connected to the memory stacked chip and the frequency boosting interface chip.

19 Claims, 22 Drawing Sheets

MEMORY CARD

CROSS-REFERENCE TO RELATED APPLICATION

This application is based on and claims priority under 35 U.S.C. § 119 to Korean Patent Application No. 10-2020-0175829, filed on Dec. 15, 2020, in the Korean Intellectual Property Office, the disclosure of which is incorporated by reference herein in its entirety.

BACKGROUND

The inventive concept relates to a memory card, and more particularly, to a memory card in which both endurance and operation speed may be improved while capacity is increased.

Since memory cards may easily store and carry data having high capacity, memory cards may be widely used in mobile phones, notebook computers, digital cameras, or the like. As the capacity of memory cards increases, the endurance and operation speed thereof may decrease. Accordingly, a memory card in which both endurance and operation speed are improved while increasing the capacity may be needed for various applications.

SUMMARY

The inventive concept provides a memory card in which both endurance and operation speed may be improved while capacity is increased.

According to some embodiments of the inventive concept, there is provided a memory card including an upper case, a lower case, and an integrated circuit package between the upper case and the lower case. The integrated circuit package includes a memory stacked chip on a panel substrate, and the memory stacked chip includes a base memory stacked chip and an additional memory stacked chip stacked on the base memory stacked chip, a frequency boosting interface chip on the panel substrate and electrically connected to the memory stacked chip, and a controller chip on the panel substrate and electrically connected to the memory stacked chip and the frequency boosting interface chip.

According to some embodiments of the inventive concept, there is provided a memory card including a memory stacked chip on a panel substrate, and the memory stacked chip includes a base memory stacked chip and an additional memory stacked chip stacked on the base memory stacked chip, a frequency boosting interface chip on the panel substrate and electrically connected to the memory stacked chip, and a controller chip on the panel substrate and electrically connected to the memory stacked chip and the frequency boosting interface chip.

According to some embodiments of the inventive concept, there is provided memory card including a memory stacked chip including a plurality of memory chips stacked on a panel substrate in a staircase shape and adhered to each other by an adhesive layer. The memory stacked chip includes a base memory stacked chip and an additional memory stacked chip on the base memory stacked chip, a first connection member that electrically connects the memory stacked chip to the panel substrate and electrically connects the plurality of memory chips to each other, a frequency boosting interface chip on the panel substrate and is spaced apart from the memory stacked chip, a second connection member that electrically connects the frequency boosting interface chip to the memory stacked chip, a third connection member that electrically connects the frequency boosting interface chip to the panel substrate, a controller chip on the panel substrate and is apart from the frequency boosting interface chip, and a fourth connection member that electrically connects the controller chip to the panel substrate.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
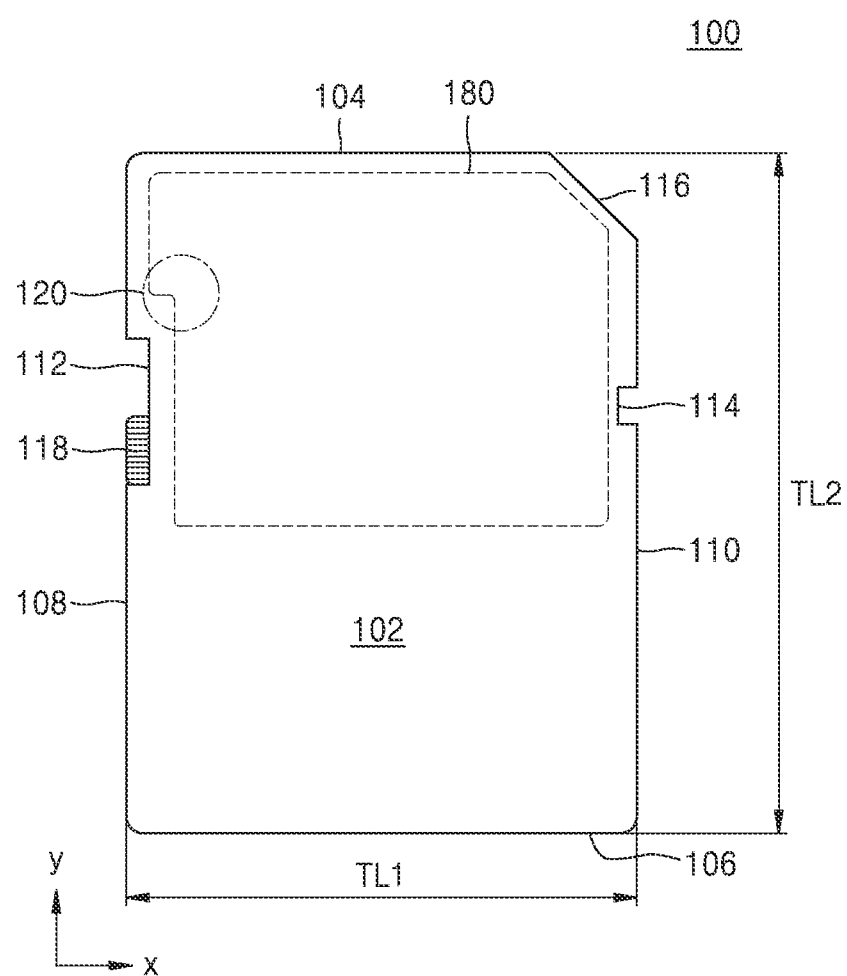
FIGS. 1 to 3 are diagrams illustrating a memory card according to some embodiments of the inventive concept.

Hereinafter, one or more embodiments of the inventive concept will be described in detail with reference to the attached drawings. The following embodiments of the present invention may be implemented by only one embodiment, and the following embodiments may be implemented by combining one or more embodiments. Accordingly, the inventive concept is not limited to one embodiment.

An expression used in the singular encompasses the expression of the plural, unless it has a clearly different meaning in the context. Sizes of components in the drawings may be exaggerated for convenience of explanation.

Figure 2:
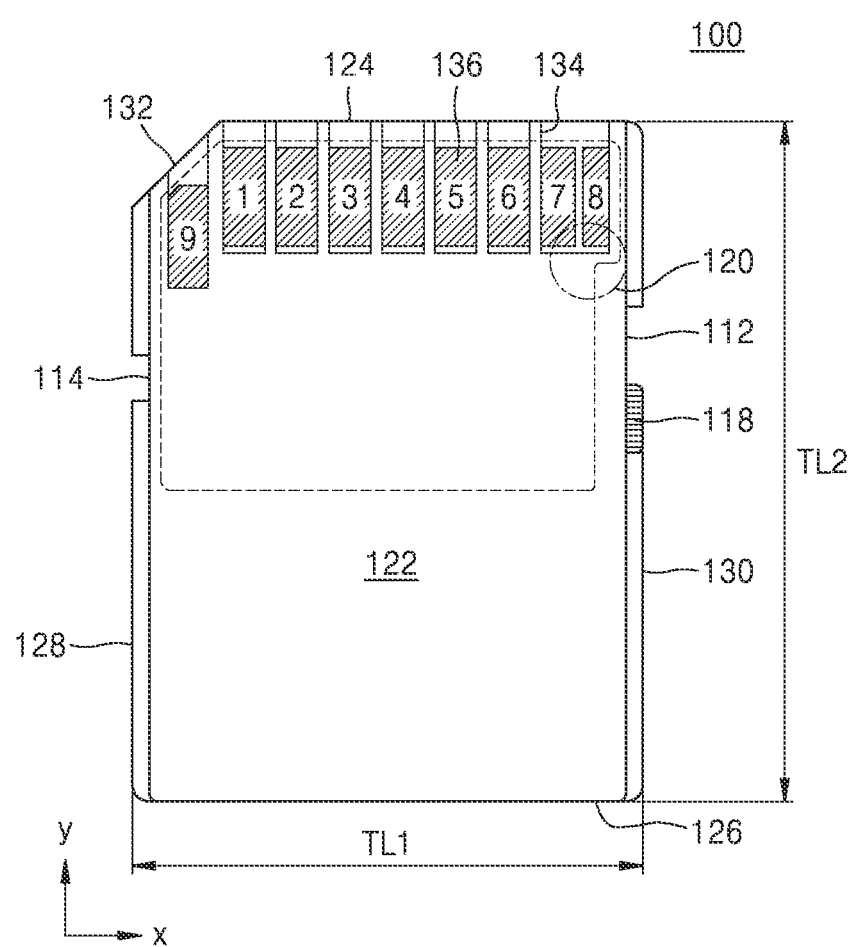
Figure 3:
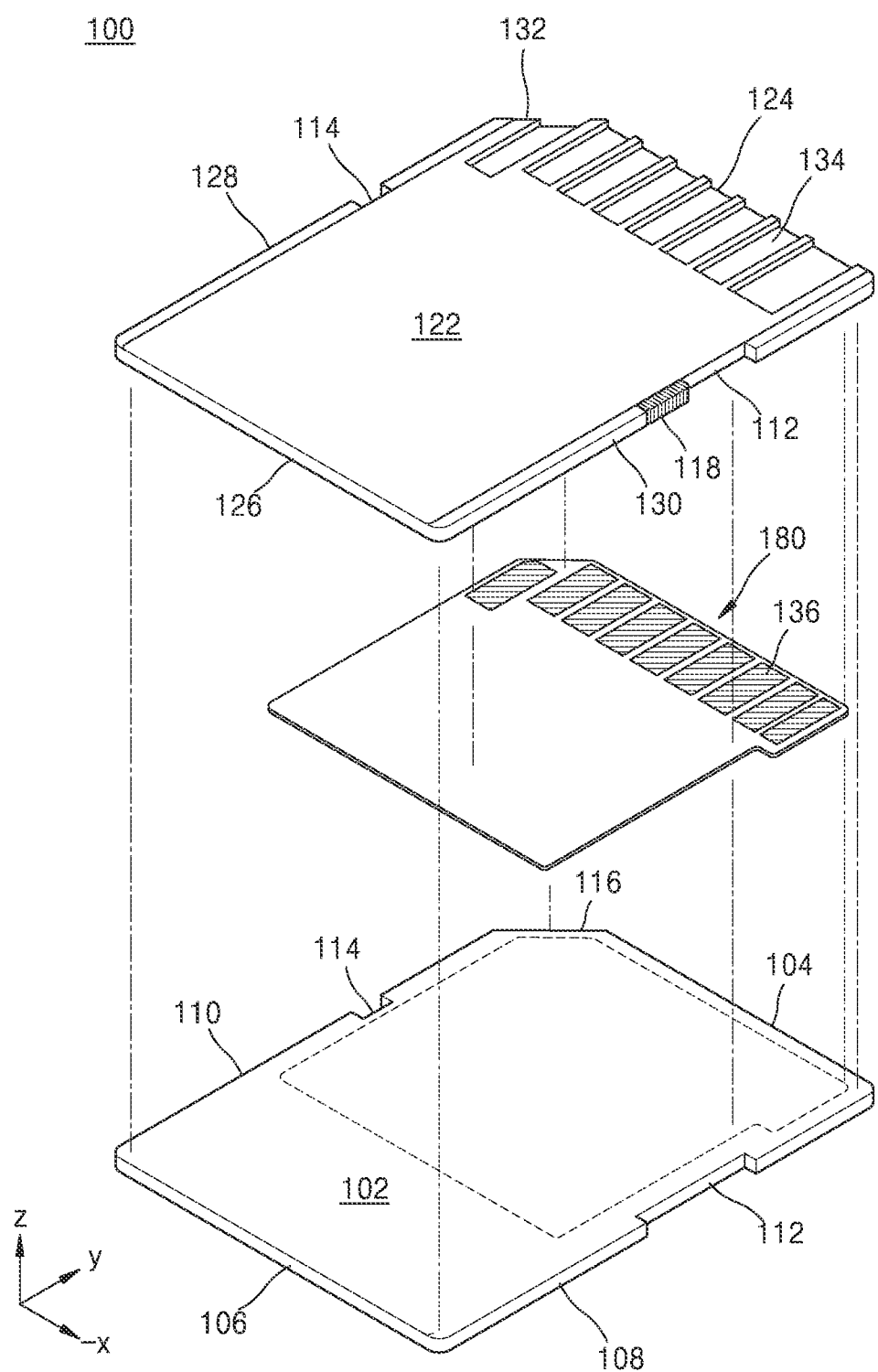

FIGS. 1 to 3 are diagrams illustrating a memory card 100 according to some embodiments of the inventive concept.

In detail, FIGS. 1 and 2 may be respectively a top plan view and a bottom plan view of the memory card 100. FIG. 3 is an exploded perspective view of the memory card 100. An x-axis direction and a y-axis direction may be horizontal directions horizontal to the memory card 100 or a surface of an integrated circuit package 180.

The y-axis direction may be a direction perpendicular to the x-axis direction on the memory card 100 or the surface of the integrated circuit package 180. A z-axis direction may be a direction perpendicular to the x-axis direction and the y-axis direction. The x-axis direction and the y-axis direction may be a short-axis direction and a long-axis direction of the memory card 100 or the integrated circuit package 180, respectively.

The memory card 100 may be a secure digital (SD) card. The memory card 100 may include a case and the integrated circuit package 180, the case including an upper case 102 and a lower case 122. The integrated circuit package 180 may also be referred to as a semiconductor package. The upper case 102 and the lower case 122 may surround the integrated circuit package 180 according to the form or the shape of the integrated circuit package 180. The upper case 102 may be coupled to the lower case 122.

The upper case 102 and the lower case 122 may also be referred to as a housing. The upper case 102 and the lower case 122 may also be referred to as outer lids. When the memory card 100 is an SD card, the sizes of the upper case 102 and the lower case 122 may be set to standard specifications. The memory card 100, that is, the upper case 102 and the lower case 122, may have lengths TL1 and TL2 respectively in the x-axis direction and the y-axis direction. In some embodiments, the lengths TL1 and TL2 may be 24 mm and 32 mm, respectively. In FIGS. 1 and 2, main components of the upper case 102 and the lower case 122 will be mainly described.

As shown in FIG. 1, the upper case 102 may include a first upper case edge 104 and a second upper case edge 108 connected to the first upper case edge 104. In addition, the upper case 102 may include a third upper case edge 106 connected to the second upper case edge 108 and a fourth upper case edge 110 connected to the third upper case edge 106 and the first upper case edge 104.

An upper case chamfer 116 having an inclined shape may be at a corner portion between the first upper case edge 104 and the fourth upper case edge 110. In other words, the upper case chamfer 116 having a shape in which a corner is cut off may be between the first upper case edge 104 and the fourth upper case edge 110.

As shown in FIG. 2, the lower case 122 may include a first lower case edge 124 and a second lower case edge 130 connected to the first lower case edge 124. In addition, the lower case 122 may include a third lower case edge 126 connected to the second lower case edge 130 and a fourth lower case edge 128 connected to the third lower case edge 126 and the first lower case edge 124.

A lower case chamfer 132 having an inclined shape may be at a corner portion between the first lower case edge 124 and the fourth lower case edge 128. In other words, the lower case chamfer 132 having a shape in which a corner is cut off may be between the first lower case edge 124 and the fourth lower case edge 128.

The lower case 122 may include opening portions 134 exposing external contact terminals 136 of the integrated circuit package 180. The external contact terminals 136 may include first to ninth external contact terminals 1 to 9.

The external contact terminals 136 may be signal terminals, ground terminals, and/or power terminals. The first to eighth external contact terminals 1 to 8 of the external contact terminals 136 may be aligned in a horizontal direction (x-axis direction), and the ninth external contact terminal 9 may be on a lower side than that of the first to eighth external contact terminals 1 to 8 in a negative vertical direction (−y-axis direction) due to the upper and lower case chambers 116 and 132.

As shown in FIG. 3, in the memory card 100, the integrated circuit package 180 may be between the upper case 102 and the lower case 122. In other words, the integrated circuit package 180 may be inside the upper case 102 and the lower case 122. In FIG. 3, for convenience, the upper case 102 is arranged below the integrated circuit package 180, and the lower case 122 is arranged above the integrated circuit package 180.

The first upper case edge 104, the second upper case edge 108, the third upper case edge 106, and the fourth upper case edge 110 may be aligned and coupled to the first lower case edge 124, the second lower case edge 130, the third lower case edge 126, and the fourth lower case edge 128, respectively. The upper case chamfer 116 may be aligned and coupled to the lower case chamfer 132.

Each of the upper case 102 and the lower case 122 may include a first recessed groove 112 and a second recessed groove 114. The first recessed grooves 112 of the upper case 102 and the lower case 122 may be at the second upper case edge 108 and the second lower case edge 130 to be adjacent to the first upper case edge 104 and the second lower case edge 130, respectively. The first recessed grooves 112 of the upper case 102 and the lower case 122 may be grooves respectively recessed into the upper case 102 and the lower case 122.

In other words, the first recessed grooves 112 of the upper case 102 and the lower case 122 may be recesses in grooves respectively recessed into the upper case 102 and the lower case 122.

A switch 118 may be in the first recessed groove 112 of the upper case 102 and the lower case 122. The switch 118 may move up and down in the first recessed groove 112 of the upper case 102 and the lower case 122. The switch 118 may be a member controlling turning on/off of a write function of the integrated circuit package 180. The switch 118 may be a member controlling turning on/off of a write function of the memory card 100.

The second recessed grooves 114 of the upper case 102 and the lower case 122 may be at the fourth upper case edge 110 and the fourth lower case edge 128 to be adjacent to the first upper case edge 104 and the first lower case edge 124, respectively. The second recessed grooves 114 of the upper case 102 and the lower case 122 may be grooves respectively recessed into the upper case 102 and the lower case 122.

In other words, the second recessed grooves 114 of the upper case 102 and the lower case 122 may be recesses in grooves respectively recessed into the upper case 102 and the lower case 122. The second recessed grooves 114 of the upper case 102 and the lower case 122 may be grooves members or grooves used when the memory card 100 is injected into an external device.

A round notch 120 may be installed in a corner portion of the integrated circuit package 180 to be adjacent to the first recessed grooves 112 of the upper case 102 and the lower case 122. Due to the round notch 120 in the corner portion of the integrated circuit package 180, the possibility of collision between the integrated circuit package 180 and the switch 118 may be reduced, and the heat dissipation characteristics of the integrated circuit package 180 may be improved, and thus, reliability, for example, warpage of the integrated circuit package 180 may be improved.

The integrated circuit package 180 may be a system-in-package or a multi-chip package. The integrated circuit package 180 may include a memory stacked chip, a frequency boosting interface (FBI) chip, a controller chip, and a passive device. The integrated circuit package 180 may be a single package including a memory stacked chip, an FBI chip, a controller chip, and/or a passive device. Sizes, structures, and arrangement forms of the memory stacked chip, the FBI chip, and the controller chip forming the integrated circuit package 180 will be described in more detail below.

Figure 4:
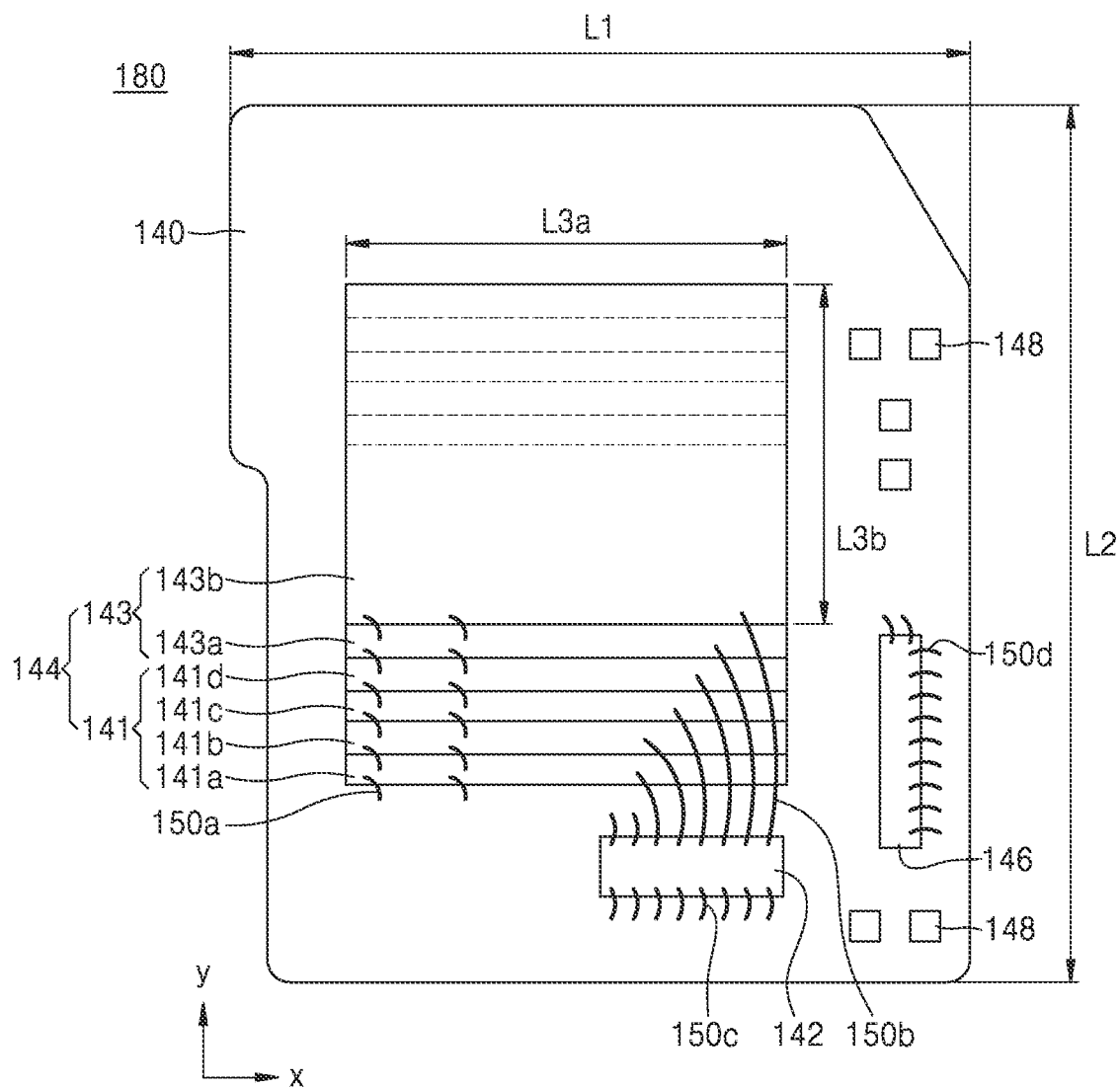
FIGS. 4 and 5 are diagrams illustrating an integrated circuit package included in the memory card of FIGS. 1 to 3.
Figure 5:
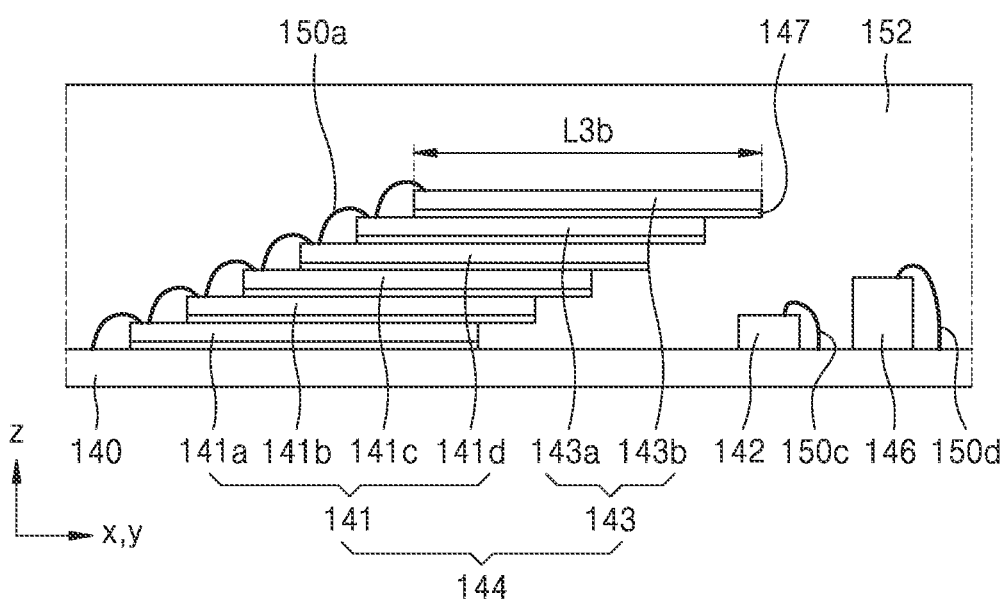

FIGS. 4 and 5 are diagrams illustrating the integrated circuit package 180 included in the memory card 100 of FIGS. 1 to 3.

In detail, FIG. 4 is a top plan view illustrating main components of the integrated circuit package 180. FIG. 5 is a cross-sectional view illustrating main components of the integrated circuit package 180. The integrated circuit package 180 may include a memory stacked chip 144 positioned on a panel substrate 140, an FBI chip 142, a controller chip 146, a passive device 148, and a molding layer 152.

The panel substrate 140 may have a length L1 and a length L2 respectively in the x-axis direction and the y-axis direction. The length L1 and the length L2 may be less than a length (TL1 of FIGS. 1 and 2) in the x-axis direction and a length (TL2 of FIGS. 1 and 2) in the y-axis direction of an upper case (102 of FIGS. 1 to 3) and a lower case (122 of FIGS. 1 to 3), respectively. The panel substrate 140 may be a substrate in the form of a printed circuit board (PCB), a lead frame, or a tape. In some embodiments, the panel substrate 140 may be a PCB. The PCB may include a dielectric core layer, and a conductive layer may be positioned on an upper surface and/or a lower surface of the dielectric core layer.

A conductive pattern (not shown) may be formed below and/or above the panel substrate 140. The conductive pattern may include contact terminals, contact pads, lead patterns, connectors, or the like. The conductive pattern may be a pattern for electrical connections between electronic devices mounted on the panel substrate 140 and external electronic devices.

The memory stacked chip 144 may be a stacked structure in which a plurality of memory chips 141 and 143 are stacked on the panel substrate 140 in a staircase shape. The plurality of memory chips 141 and 143 may have lengths L3a and L3b respectively in the x-axis direction and the y-axis direction. In some embodiments, the length L3a in the x-axis direction may be greater than the length L3b in the y-axis direction. The plurality of memory chips 141 and 143 may be adhered to each other by using an adhesive layer 147.

The plurality of memory chips 141 and 143 may be electrically connected to the panel substrate 140 by using a first connection member 150a, for example, a bonding wire. The plurality of memory chips 141 and 143 may be electrically connected to each other by using the first connection member 150a. The plurality of memory chips 141 and 143 may be vertical NAND flash memory chips. The memory stacked chip 144 may include a base memory stacked chip 141 and an additional memory stacked chip 143.

In some embodiments, the plurality of memory chips 141 and 143 may be highly integrated to include memory cells corresponding to a data storage method of a triple-level cell (TLC) method or a quad-level cell (QLC) and include chips having a large storage capacity.

In other words, the plurality of memory chips 141 and 143 may include chips having a large storage capacity by being highly integrated and manufactured according to a TLC method or a QLC method. In some embodiments, the storage capacity of the plurality of memory chips 141 and 143 may be 16 Giga Bytes (GB), 32 GB, 64 GB, or 128 GB.

In some embodiments, when the plurality of memory chips 141 and 143 include memory cells corresponding to the data storage method of a QLC method, the plurality of memory chips 141 and 143 use a data storage method of a TLC method, a multi-level cell (MLC) method, or a single-level cell (SLC) method when operating in the memory card (100 of FIGS. 1 to 3) and the integrated circuit package 180. Such a data storage method is performed by using the controller chip 146. The data storage method of the plurality of memory chips 141 and 143 will be described in more detail below.

In some embodiments, when the plurality of memory chips 141 and 143 include memory cells corresponding to the data storage method of a TLC method, the plurality of memory chips 141 and 143 use a data storage method of a MLC method or an SLC method when operating in the memory card (100 of FIGS. 1 to 3) and the integrated circuit package 180. Such a data storage method is performed by using the controller chip 146. The data storage method of the plurality of memory chips 141 and 143 will be described in more detail below.

In some embodiments, the number of memory chips of the additional memory stacked chip 143 may be about 0.5 times to about 2 times the number of memory chips of the base memory stacked chip 141 according to a data storage method.

For example, as shown in FIG. 4, the base memory stacked chip 141 may include four memory chips 141a, 141b, 141c, and 141d, and the additional memory stacked chip 143 may include two memory chips 143a and 143b, which is 0.5 times of the number (i.e., four) of memory chips of the base memory stacked chip 141.

In more detail, the total number of memory chips 141a, 141b, 141c, 141d, 143a, and 143b of the base memory stacked chip 141 and the additional memory stacked chip 143 is six, and when a storage capacity of each of the memory chips 141a, 141b, 141c, 141d, 143a, and 143b is 32 GB, the total storage capacity of the memory stacked chip 144 may be arithmetically 192 GB.

However, when the data storage method of the memory stacked chip 144, which includes memory cells corresponding to the data storage method of a TLC method, uses an MLC method, the total storage capacity of the memory stacked chip 144 may be 128 GB. In addition, when the memory stacked chip 144, which includes memory cells corresponding to the data storage method of a TLC method, uses an SLC method as the data storage method, the total storage capacity of the memory stacked chip 144 may be 64 GB.

As such, compared to a case where a TLC method is used, the storage capacity of the memory stacked chip 144 may be ⅔ (about 67%) of the total storage capacity of the base memory stacked chip 141 and the additional memory stacked chip 143 when an MLC method is used. In addition, compared to a case where a TLC method is used, the storage capacity of the memory stacked chip 144 may be ⅓ (about 33%) of the total storage capacity of the base memory stacked chip 141 and the additional memory stacked chip 143 when an SLC method is used.

In some embodiments, unlike FIGS. 4 and 5, when the base memory stacked chip 141 includes two memory chips, the number of memory chips of the additional memory stacked chip 143 may be about 0.5 times to about 2 times of the number of memory chips of the base memory stacked chip 141, that is, the additional memory stacked chip 143 may include one to four memory chips.

In some embodiments, unlike FIGS. 4 and 5, when the base memory stacked chip 141 includes 6 memory chips, the number of memory chips of the additional memory stacked chip 143 may be about 0.5 times to about 2 times of the number of memory chips of the base memory stacked chip 141, that is, the additional memory stacked chip 143 may include three to twelve memory chips.

As described above, in the memory stacked chip 144, the additional memory stacked chip 143 may be additionally stacked on the base memory stacked chip 141, and a TLC method, an MLC method, or an SLC method may be used as the data storage method of the memory chips 141a, 141b, 141c, 141d, 143a, and 143b.

In this case, the capacity of the memory stacked chip 144 may be increased and the endurance of the memory stacked chip 144, that is, the lifespan thereof, may also be increased by including the additional memory stacked chip 143. As a result, in the inventive concept, the endurance, that is, the lifespan, of the integrated circuit package 180 or the memory card 100 may be increased.

The integrated circuit package 180 includes the FBI chip 142. The FBI chip 142 may be mounted on the panel substrate 140 to be apart from the memory stacked chip 144. The FBI chip 142 may be electrically connected to the memory stacked chip 144 by using a second connection member 150b, for example, a bonding wire. The FBI chip 142 may be electrically connected to the panel substrate 140 by using a third connection member 150c, for example, a bonding wire.

In the present embodiment, although the FBI chip 142 is illustrated as being electrically connected to the memory stacked chip 144 by using the second connection member 150b, the FBI chip 142 may be electrically connected to the memory stacked chip 144 through the panel substrate 140. The FBI chip 142 may be electrically connected to the memory stacked chip 144 through a plurality of connection channels, for example, two connection channels, to increase the operation speed of the integrated circuit package 180 or the memory card (100 of FIGS. 1 to 3).

The integrated circuit package 180 includes the controller chip 146. The controller chip 146 may be arranged on the panel substrate 140 to be apart from the memory stacked chip 144 and the FBI chip 142. The controller chip 146 may be electrically connected to the panel substrate 140 by using a fourth connection member 150d, for example, a bonding wire.

The controller chip 146 may be electrically connected to the memory stacked chip 144 and the FBI chip 142. The controller chip 146 may control the memory stacked chip 144 through the FBI chip 142. The controller chip 146 may be used to store or read data in the memory stacked chip 144 according to a data storage method.

The integrated circuit package 180 may include the passive device 148 and the molding layer 152. The passive device 148 may be a capacitor and/or a resistor. The molding layer 152 may be an epoxy layer. The molding layer 152 may mold the memory stacked chip 144, the FBI chip 142, the controller chip 146, and the passive device 148, which are positioned on the panel substrate 140. In other words, the molding layer 152 may fill or occupy spaces between the various components of the integrated circuit package 180.

As described above, the integrated circuit package 180 included in the memory card (100 of FIGS. 1 to 3) may include the additional memory stacked chip 143 to increase the capacity thereof, and may increase the endurance thereof, that is, the lifespan thereof, by using a TLC method, an MLC method, or an SLC method as a data storage method.

In addition, the integrated circuit package 180 included in the memory card (100 of FIGS. 1 to 3) of the inventive concept may include the FBI chip 142, and the FBI chip 142 may be electrically connected to the memory stacked chip 144 through a plurality of connection channels, for example, two connection channels, and thus, the operation speed of the integrated circuit package 180 may be increased.

Figure 6:
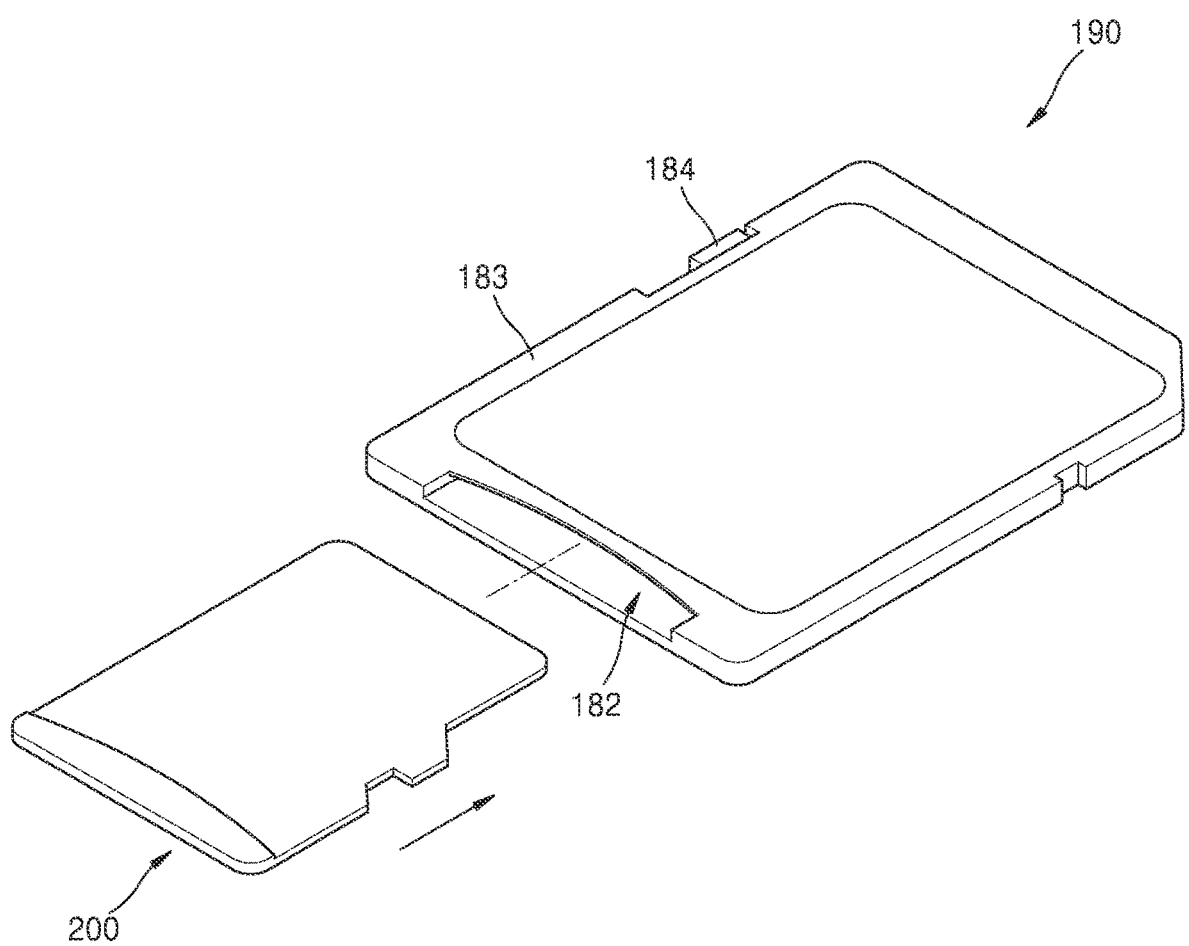
FIG. 6 is a perspective view illustrating a memory card according to some embodiments of the inventive concept and a memory card adapter into which the memory card may be inserted.

FIG. 6 is a perspective view illustrating a memory card 200 according to some embodiments of the inventive concept and a memory card adapter 190 into which the memory card 200 may be inserted.

In detail, FIG. 6 is a perspective view illustrating the front of the memory card 200 and the memory card adapter 190 according to example embodiments of the inventive concept. The memory card 200 may be inserted into the memory card adapter 190.

The memory card adapter 190 may include an insertion portion 182 into which the memory card 200 may be inserted, a case 183, and a switch 184. The switch 184 may be a member that turns on or off a write function of the memory card 200. The memory card 200 may be inserted into the insertion portion 182 to be completely accommodated into or at least partially seated in the memory card adapter 190.

The memory card 200 may be inserted into the memory card adapter 190, and the memory card 200 may input/output data to/from an external device through the memory card adapter 190. In some embodiments, the memory card 200 may be an SD card.

Although the memory card 200 is illustrated similarly to a micro SD card in FIG. 6, it is not limited thereto, and the inventive concept may be applied to various memory cards such as a mini SD card or the like.

Figure 7:
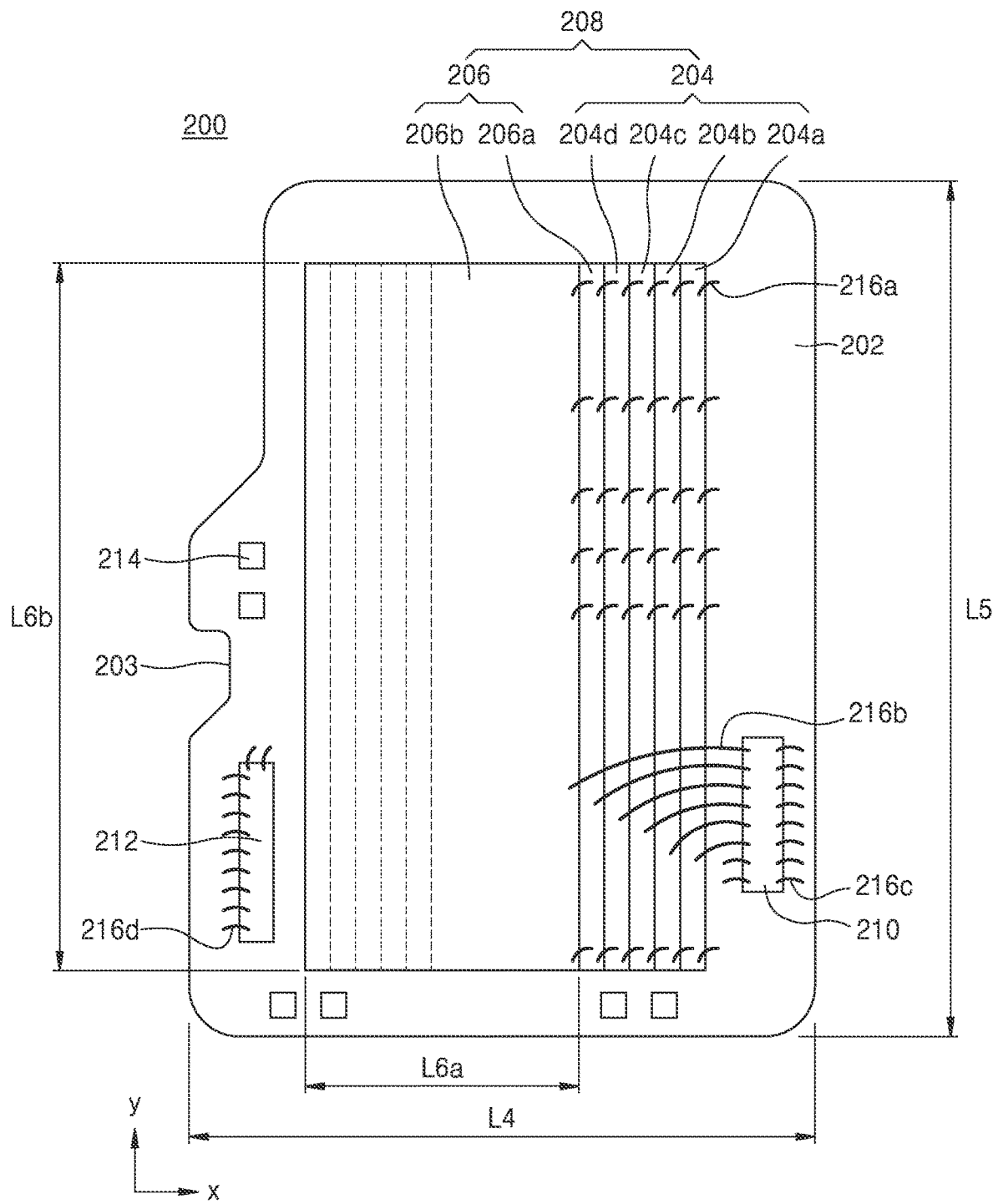
FIGS. 7 to 9 are diagrams illustrating the memory card of FIG. 6.
Figure 8:
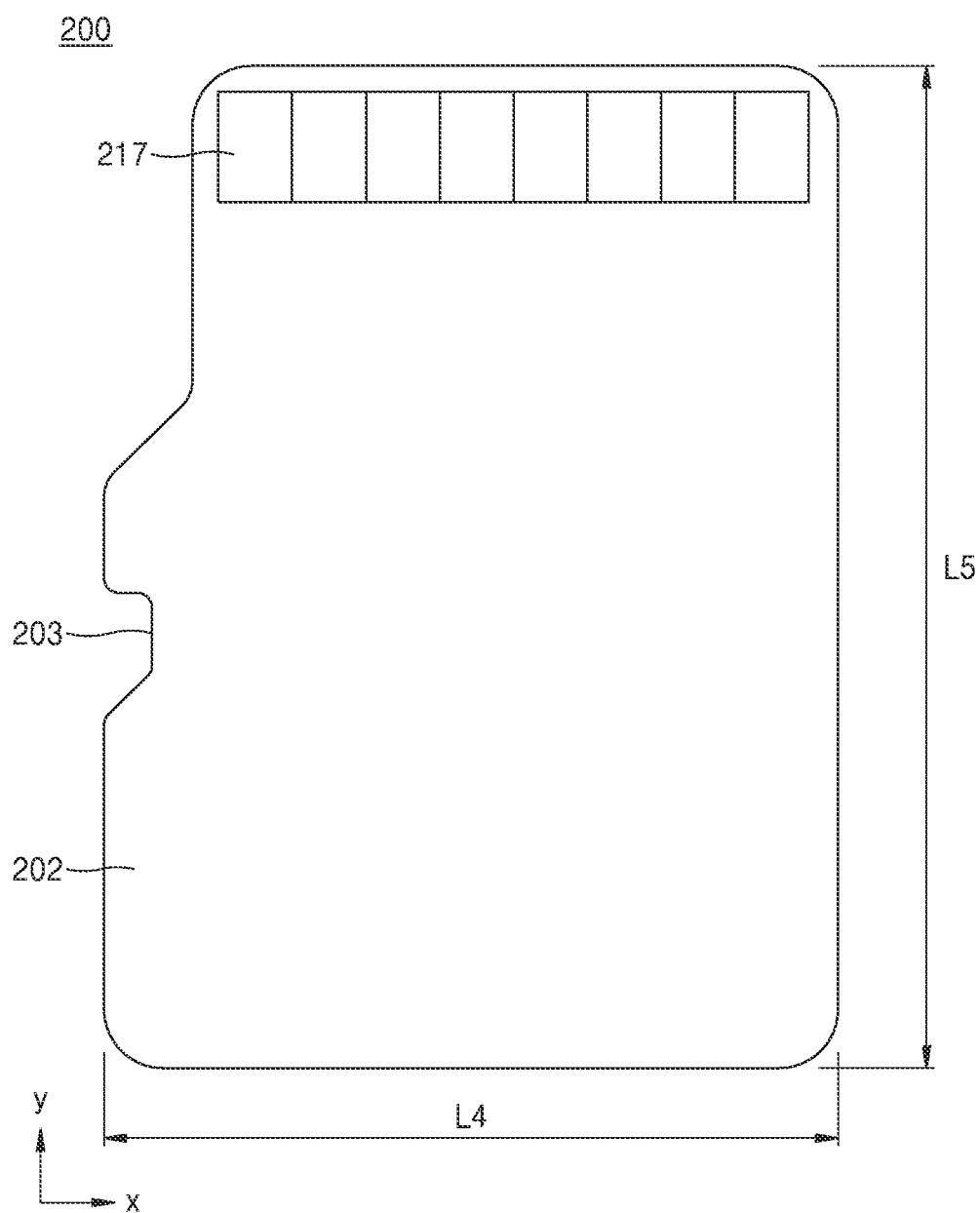
Figure 9:
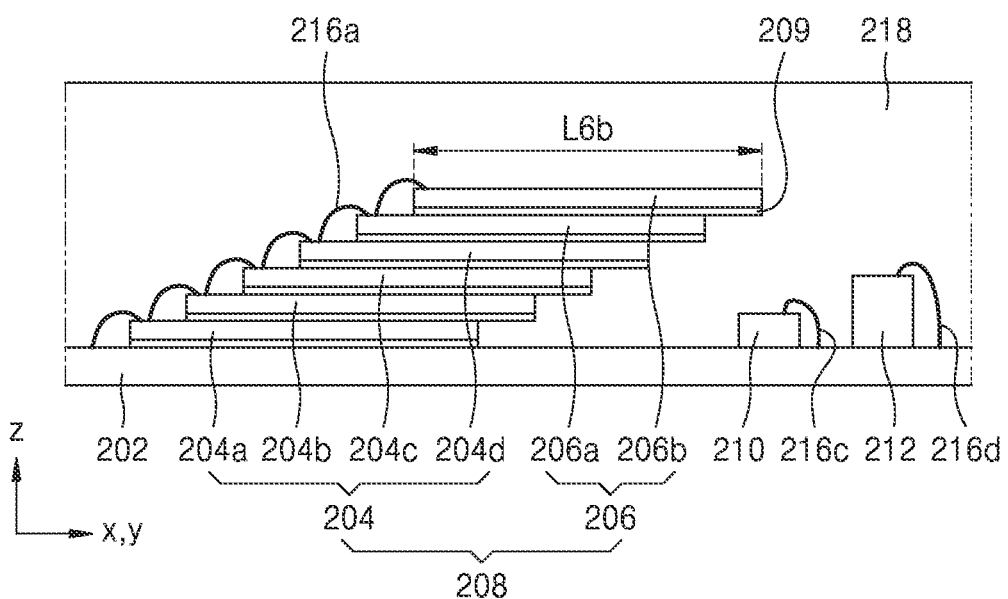

FIGS. 7 to 9 are diagrams illustrating the memory card 200 of FIG. 6.

In detail, FIG. 7 may be a top plan view illustrating main components of the memory card 200. FIG. 8 may be a bottom plan view illustrating main components of the memory card 200. FIG. 9 may be a cross-sectional view illustrating main components of the memory card 200.

The memory card 200 may have the same or similar components as that of the integrated circuit package 180 of FIGS. 4 and 5. Descriptions of the memory card 200, which are the same as those of the integrated circuit package 180 of FIGS. 4 and 5, are briefly given or omitted.

The memory card 200 may include a memory stacked chip 208 positioned on a panel substrate 202, an FBI chip 210, a controller chip 212, a passive device 214, and a molding layer 218.

The memory card 200 and the panel substrate 202 may have a length L4 and a length L5 respectively in an x-axis direction and a y-axis direction. The length L5 in the y-axis direction may be greater than the length L4 in the x-axis direction. In some embodiments, the length L4 in the x-axis and the length L5 in the y-axis direction may be about 11 mm and about 15 mm, respectively. The panel substrate 202 may include the same material as that of the panel substrate 140 of FIGS. 4 and 5.

External contact terminals 217 may be formed on lower surfaces of the memory card 200 and the panel substrate 202. The external contact terminals 217 may be provided for electrical connections between electronic devices mounted on the panel substrate 202 and external electronic devices. The external contact terminals 217 may be signal terminals, ground terminals, and power terminals.

The memory stacked chip 208 may be a stacked structure in which a plurality of memory chips 204 and 206 are stacked on the panel substrate 202 in a staircase shape. The plurality of memory chips 204 and 206 may have lengths L6a and L6b respectively in the x-axis direction and the y-axis direction. In some embodiments, the length L6a in the x-axis direction may be less than the length L6b in the y-axis direction. The plurality of memory chips 204 and 206 may be adhered to each other by using an adhesive layer 209. The memory stacked chip 208 may correspond to the memory stacked chip 144 of FIGS. 4 and 5. The plurality of memory cells 204 and 206 may correspond to the plurality of memory chips 141 and 143 of FIGS. 4 and 5.

The plurality of memory chips 204 and 206 may be electrically connected to the panel substrate 202 by using a first connection member 216a, for example, a bonding wire. The plurality of memory chips 204 and 206 may be electrically connected to each other by using the first connection member 216a. The plurality of memory chips 204 and 206 may be vertical NAND flash memory chips.

The memory stacked chip 208 may include a base memory stacked chip 204 and an additional memory stacked chip 206. For example, the base memory stacked chip 204 may include four memory chips 204a, 204b, 204c, and 204d, and the additional memory stacked chip 206 may include two memory chips 206a and 206b, which is 0.5 times of the number (i.e., four) of memory chips of the base memory stacked chip 204. The base memory stacked chip 204 and the additional memory stacked chip 206 may correspond to the base memory stacked chip 141 and the additional memory stacked chip 143 of FIGS. 4 and 5, respectively.

In some embodiments, the plurality of memory chips 204 and 206 may be chips having a large storage capacity which are physically integrated to correspond to a data storage method of a QLC method or a TLC method. For example, the storage capacity of the plurality of memory chips 204 and 206 may be 16 GB, 32 GB, 64 GB, or 128 GB.

However, the plurality of memory chips 204 and 206 of the memory card 200 of the inventive concept store data by using a TLC method, an MLC method, or an SLC method as a data storage method. The data storage method of the plurality of memory chips 204 and 206 will be described in more detail below.

In some embodiments, the number of memory chips of the additional memory stacked chip 206 may be about 0.5 times to about 2 times of the number of memory chips of the base memory stacked chip 204 according to a data storage method. In some embodiments, compared to a case where a TLC method is used, the storage capacity of the memory stacked chip 208 may be ⅔ (about 67%) or ⅓ (about 33%) of the total storage capacity of the base memory stacked chip 204 and the additional memory stacked chip 206 according to a data storage method. In some embodiments, unlike FIGS. 7 and 9, the base memory stacked chip 204 may include two memory chips or six memory chips.

As described above, in the memory stacked chip 208, the additional memory stacked chip 206 may be additionally stacked on the base memory stacked chip 204, and a TLC method, an MLC method, or an SLC method may be used as the data storage method of the memory chips 204a, 204b, 204c, 204d, 206a and 206b.

In this case, the capacity of the memory stacked chip 208 may be increased and the endurance of the memory stacked chip 208, that is, the lifespan thereof, may also be increased by including the additional memory stacked chip 206. As a result, in the inventive concept, the endurance of the memory card 200, that is, the lifespan thereof, may be increased.

The memory card 200 includes the FBI chip 210. The FBI chip 210 may correspond to the FBI chip 142 of FIGS. 4 and 5. The FBI chip 210 may be mounted on the panel substrate 202 to be apart from the memory stacked chip 208.

The FBI chip 210 may be electrically connected to the memory stacked chip 208 by using a second connection member 216b, for example, a bonding wire. The FBI chip 210 may be electrically connected to the panel substrate 202 by using a third connection member 216c, for example, a bonding wire.

In some embodiments, the FBI chip 210 is illustrated as being electrically connected to the memory stacked chip 208 by using the second connection member 216b, the FBI chip 210 may be electrically connected to the memory stacked chip 208 through the panel substrate 202. The FBI chip 210 may be electrically connected to the memory stacked chip 208 through a plurality of connection channels, for example, two connection channels, to increase the operation speed of the memory card 200.

The memory card 200 includes the controller chip 212. The controller chip 212 may correspond to the controller chip 146 of FIGS. 4 and 5. The controller chip 212 may be arranged on the panel substrate 202 to be apart from the memory stacked chip 208 and the FBI chip 210. The controller chip 212 may be electrically connected to the panel substrate 202 by using a fourth connection member 216d, for example, a bonding wire.

The controller chip 212 may be electrically connected to the memory stacked chip 208 and the FBI chip 210. The controller chip 212 may control the memory stacked chip 208 through the FBI chip 210. The controller chip 212 may be used to store or read data in the memory stacked chip 208 according to a data storage method.

The memory card 200 may include the passive device 214 and the molding layer 218. The passive device 214 may be a capacitor and/or a resistor. The molding layer 218 may be an epoxy layer. The molding layer 218 may mold the memory stacked chip 208, the FBI chip 210, the controller chip 212, and the passive device 214, which are positioned on the panel substrate 202. In other words, the molding layer 218 may occupy spaces between the various components of the memory card 200.

As described above, the memory card 200 of the inventive concept may increase the capacity thereof and the endurance thereof, that is, the lifespan thereof, by using an MLC method or an SLC method as the data storage method.

In addition, the memory card 200 of the inventive concept may include the FBI chip 210, and the FBI chip 210 may be electrically connected to the memory stacked chip 208 through a plurality of connection channels, for example, two connection channels, and thus, the operation speed of the memory card 200 may be increased.

Figure 10:
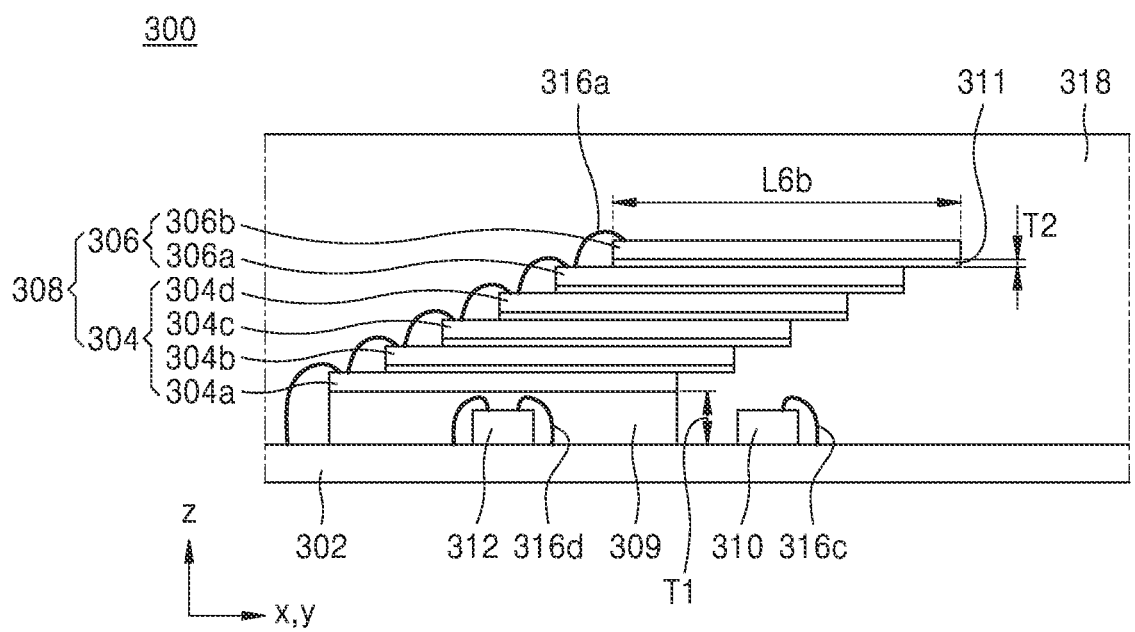
FIG. 10 is a cross-sectional view illustrating a memory card according to some embodiments of the inventive concept.

FIG. 10 is a cross-sectional view of a memory card 300 according to some embodiments of the inventive concept.

In detail, the memory card 300 may be substantially the same as the memory card 200 of FIGS. 7 to 9 except that a controller chip 312 is arranged in a base adhesive layer 309 on a panel substrate 302. In FIG. 10, the same reference symbols as those in FIGS. 7 to 9 denote like elements. In FIG. 10, the same descriptions as those provided with reference to FIGS. 7 to 9 will be briefly provided or omitted.

The memory card 300 may include a memory stacked chip 308 positioned on the panel substrate 302, an FBI chip 310, the controller chip 312, and a molding layer 318.

The panel substrate 302 may correspond to the panel substrate 202 of FIGS. 7 to 9. The memory stacked chip 308 may correspond to the memory stacked chip 208 of FIGS. 7 to 9. The memory stacked chip 308 may be a stacked structure in which a plurality of memory chips 304 and 306 are stacked in a staircase shape. The plurality of memory chips 304 and 306 may correspond to the plurality of memory chips 204 and 206 of FIGS. 7 to 9. A length of the plurality of memory chips 304 and 306 may be L6b in the y-axis direction.

In other words, the plurality of memory chips 304 and 306 may have a length L6b in the y-axis direction.

The plurality of memory chips 304 and 306 may be electrically connected to the panel substrate 302 by using a first connection member 316a, for example, a bonding wire. The plurality of memory chips 304 and 306 may be electrically connected to each other by using the first connection member 316a. The memory stacked chip 308 may include a base memory stacked chip 304 and an additional memory stacked chip 306. The base memory stacked chip 304 and the additional memory stacked chip 306 may respectively correspond to the base memory stacked chip 204 and additional memory stacked chip 206 of FIGS. 7 to 9.

The FBI chip 310 may correspond to the FBI chip 210 of FIGS. 7 to 9. The FBI chip 310 may be mounted on the panel substrate 302 to be spaced apart from the memory stacked chip 308. The FBI chip 310 may be electrically connected to the memory stacked chip 308 by using a second connection member (not shown), for example, a bonding wire. The FBI chip 310 may be electrically connected to the panel substrate 302 by using a third connection member 316c, for example, a bonding wire.

The memory card 300 includes the controller chip 312. The controller chip 312 may correspond to the controller chip 212 of FIGS. 7 to 9. The controller chip 312 may be arranged in the base adhesive layer 309 on the panel substrate 302. A memory chip 304a on a lowermost portion of the base memory stacked chip 304 may be positioned on the base adhesive layer 309. A thickness T1 of the base adhesive layer 309 may be greater than a thickness T2 of an inter-chip adhesive layer 311 between memory chips. The controller chip 312 may be electrically connected to the panel substrate 302 by using a fourth connection member 316d, for example, a bonding wire.

As described above, in the memory card 300, the controller chip 312 may be arranged in the base adhesive layer 309 below the memory chip 304a on the lowermost portion of the base memory stacked chip 304, and thus, the controller chip 312 may be electrically connected to the memory stacked chip 308 more efficiently.

Figure 11:
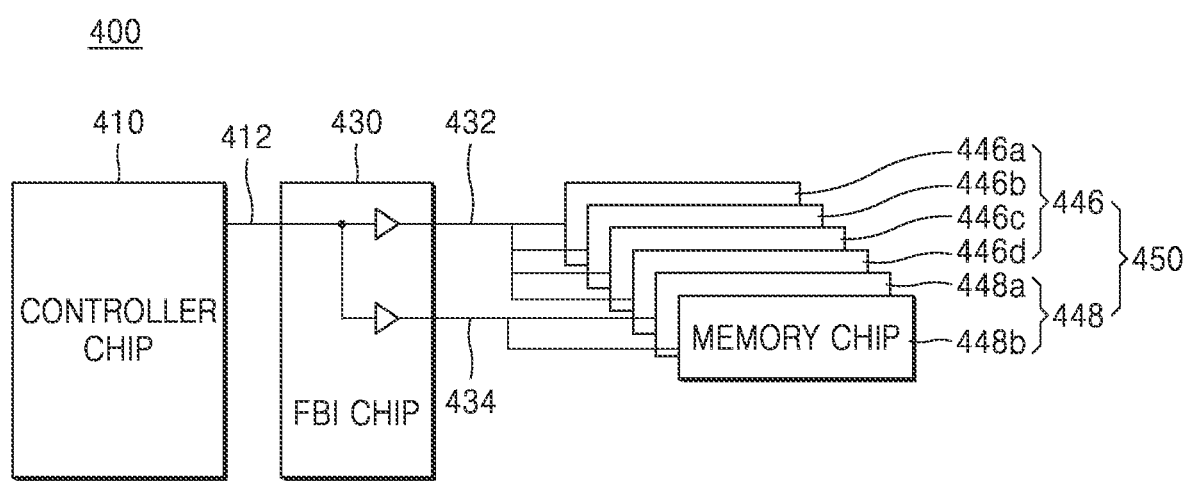
FIG. 11 is a block diagram illustrating a memory card according to some embodiments of the incentive concept.

FIG. 11 is a block diagram of a memory card 400 according to some embodiments of the inventive concept.

In detail, the memory card 400 may include a controller chip 410, an FBI chip 430, and a memory stacked chip 450.

The controller chip 410 may correspond to the controller chip 146 of FIGS. 4 and 5 or the controller chip 212 of FIGS. 7 and 9. The FBI chip 430 may correspond to the FBI chip 142 of FIGS. 4 and 5 or the FBI chip 210 of FIGS. 7 and 9.

The memory stacked chip 450 may correspond to the memory stacked chip 144 of FIGS. 4 and 5 or the memory stacked chip 208 of FIGS. 7 and 9. The memory stacked chip 450 may include a base memory stacked chip 446 and an additional memory stacked chip 438. The base memory stacked chip 446 may include memory chips 446a, 446b, 446c, and 446d, and the additional memory stacked chip 448 may include memory chips 448a and 448b.

The memory chips 446a, 446b, 446c, and 446d may correspond to the memory chips 141a, 141b, 141c, and 141d of FIGS. 4 and 5 or the memory chips 204a, 204b, 204c, and 204d of FIGS. 7 and 9. The memory chips 448a and 488b may correspond to the memory chips 143a and 143b of FIGS. 4 and 5 or the memory chips 206a and 206b of FIGS. 7 and 9.

Herein, physical and electrical connection relationships between respective components of the memory card 400 are shown.

The controller chip 410 may be connected to the FBI chip 430 through a control channel 412. Control signals and data may be transmitted between the controller chip 410 and the FBI chip 430 through the control channel 412. The control channel 412 may be an electrical signal line connecting input/output (I/O) ports of the controller chip 410 to input/output (I/O) ports of the FBI chip 430.

The FBI chip 430 may be connected to the memory stacked chip 450 through a plurality of memory channels 432 and 434, for example, a first memory channel 432 and a second memory channel 434. Control signals and data may be transmitted between the FBI chip 430 and the memory stacked chip 450 through the first memory channel 432 and the second memory channel 434.

The first memory channel 432 and the second memory channel 434 may be electrical signal lines connecting the I/O ports of the FBI chip 430 to I/O ports of the memory chips 446a, 446b, 446c, 446d, 448a, and 448b forming the memory stacked chip 450.

Although FIG. 11 illustrates that two memory channels, that is, the first and second memory channels 432 and 434, are allocated and connected to one control channel 412, three or more memory channels may also be connected to the control channel 412.

In some embodiments, the first memory channel 432 may be connected to the base memory stacked chip 446, and the second memory channel 434 may be connected to the additional memory stacked chip 448. In some embodiments, the first memory channel 432 may be connected to four memory chips 446a, 446b, 446c, and 446d, and the second memory channel 434 may be connected to two memory chips 448a and 448b. In some embodiments, unlike FIG. 11, the first memory channel 432 may be connected to three memory chips 446a, 446b, and 446c, and the second memory channel 434 may be connected to three memory chips 446d, 448a, and 448b.

The controller chip 410 may control erase, write, and/or read operations of the memory card 400. The controller chip 410 outputs control signals or data to the memory stacked chip 450 through the FBI chip 430, or receives control signals or data from the memory stacked chip 450 through the FBI chip 430.

The controller chip 410 may generate a control signal for performing erase, write, and/or read operations on the memory chips 446a, 446b, 446c, 446d, 448a, and 448b connected to a plurality of memory channels, for example, the first and second memory channels 432 and 434. As described above, the operation speed of the memory card 400 may be increased by including a plurality of memory channels, for example, the first and second memory channels 432 and 434, between the FBI chip 430 and the memory stacked chip 450.

In addition, the FBI chip 430 included in the memory card 400 may reduce the influence of capacitance caused by the I/O ports of the memory chips 446a, 446b, 446c, 446d, 448a, and 448b respectively in the plurality of memory channels, for example, the first and second memory channels 432 and 434. For reference, when the capacitance of the I/O ports of the memory chips 446a, 446b, 446c, 446d, 448a, and 448b respectively connected to the first and second memory channels 432 and 434 increases, there is a limit in increasing the transmission speed of a signal as signal distortion occurs.

For example, the FBI chip may electrically separate the I/O ports of the memory chips 446a, 446b, 446c, 446d, 448a, and 448b respectively in the first and second memory channels 432 and 434 by using a switching circuit member. In some embodiments, the FBI chip 430 may be implemented by using a multiplexer as a switching circuit member.

The memory card 400 may limit an increase in capacitance of the I/O ports of the memory chips 446a, 446b, 446c, 446d, 448a, and 448b respectively connected to a plurality of memory channels, for example, the first and second memory channels 432 and 434, through the FBI chip 430, and thus, the transmission speed of a signal may be increased.

Figure 12:
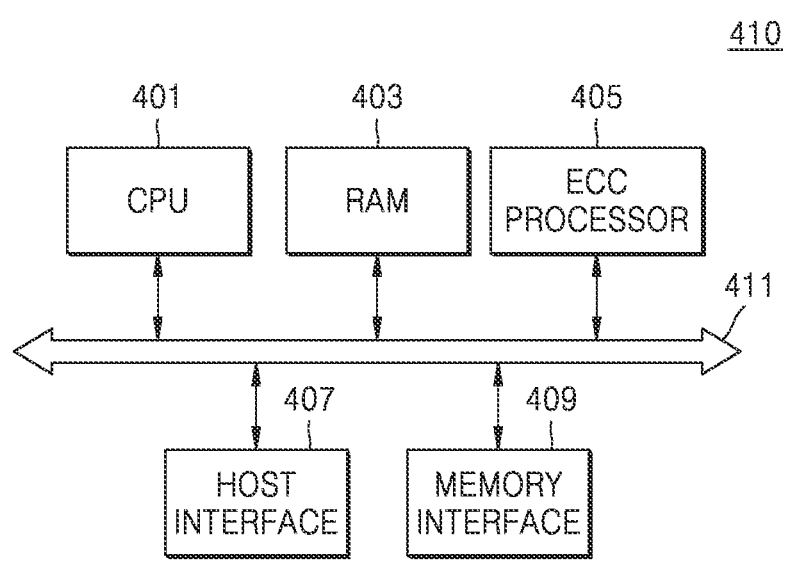
FIG. 12 is a block diagram illustrating, as an example, a detailed configuration of a controller chip included in the memory card of FIG. 11.

FIG. 12 is a block diagram illustrating, as an example, a detailed configuration of the controller chip 410 included in the memory card 400 of FIG. 11.

In detail, the controller chip 410 may include a central processing unit (CPU) 401, random access memory (RAM) 403, an error correction code (ECC) processor 405, a host interface 407, a memory interface 409, and a bus 411. Components of the controller chip 410 may be electrically connected to each other through the bus 411.

The CPU 401 may control an overall operation of the memory card (400 of FIG. 11) by using program code and data stored in the RAM 403. When the memory card (400 of FIG. 11) is initialized, the CPU 401 may read the program code and data required to control an operation performed in the memory card (400 of FIG. 11) and load the read program code and data into the RAM 403, the program code and data being stored in the memory stacked chip (450 of FIG. 11).

Data received through the host interface 407 or data received from the memory stacked chip (450 of FIG. 11) through the memory interface 409 is stored in the RAM 403. In addition, data processed by the CPU 401 or the ECC processor 405 may also be stored in the RAM 403.

In a write operation, the ECC processor 405 may generate an ECC for data to be transmitted to the memory stacked chip (450 of FIG. 11) by using an algorithm such as a Reed-Solomon (RS) code, a Hamming code, a Cyclic Redundancy Code (CRC), or the like. Also, in a read operation, an ECC received together with data from the memory stacked chip (450 of FIG. 11) may be used to perform error detection and correction processing on the received data.

The host interface 407 includes a protocol exchanging data with a host (not shown) connected to the controller chip 410 and performs an interface between the controller chip 410 and the host. The host interface 407 may be implemented as, for example, an Advanced Technology Attachment (ATA) interface, a Serial Advanced Technology Attachment (SATA) interface, a Parallel Advanced Technology Attachment (PATA) interface, a Universal Serial Bus (USB) or a Serial Attached Small Computer System (SAS) interface, a Small Computer System Interface (SCSI), an embedded Multi Media Card (eMMC) interface, a Unix File System (UFS) interface. However, the inventive concept is not limited thereto. The host interface 407 may communicate with the host for transmission of commands, addresses, and data under the control of the CPU 410.

The memory interface 409 may be electrically connected to the memory stacked chip (450 of FIG. 11). The memory interface 409 communicates with the memory stacked chip (450 of FIG. 11) for transmission of commands, addresses, and data under the control of the CPU 401. The memory interface 409 may be configured to support communication with the memory stacked chip (450 of FIG. 11), that is, a vertical NAND flash memory chip. The memory interface 409 may be connected to the base memory stacked chip 446 and the additional memory stacked chip 448 forming the memory stacked chip (450 of FIG. 11) to perform data storage in an MLC method, an SLC method, or a TLC method.

Figure 13:
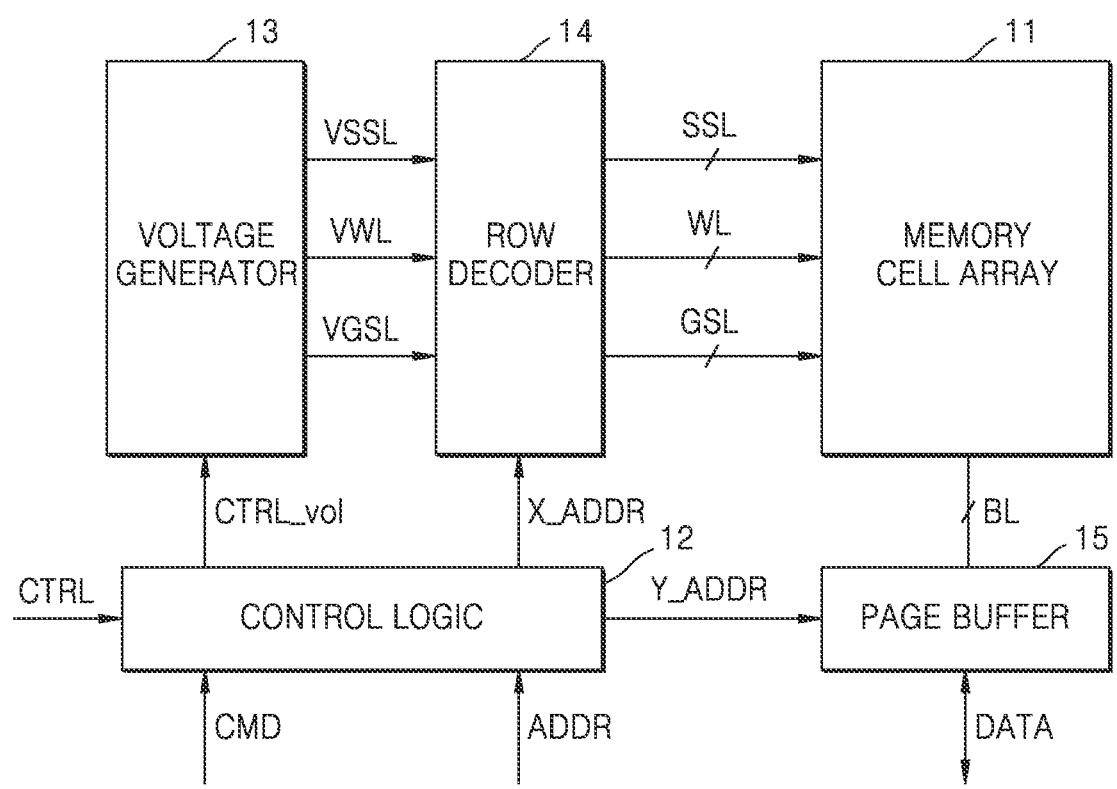
FIG. 13 is a block diagram illustrating, as an example, a detailed configuration of memory chips forming a memory stacked chip of FIG. 11.

FIG. 13 is a block diagram illustrating, as an example, a detailed configuration of memory chips forming the memory stacked chip 450 of FIG. 11.

In detail, FIG. 13 shows any one memory chip from among the memory chips (446a, 446b, 446c, 446d, 448a, and 448b of FIG. 11) forming the memory stacked chip (450 of FIG. 11). The memory chip may include a memory cell array 11, a control logic 12, a voltage generator 13, a row decoder 14, and a page buffer 15. The memory cell array 11 may be a vertical flash memory cell array.

The memory cell array 11 may be connected to at least one string selection line SSL, a plurality of word lines WL, and at least one ground selection line GSL, and may be also connected to a plurality of bit lines BL. The memory cell array 11 may include a plurality of memory cells (MC of FIGS. 18 and 19) arranged in regions where the plurality of word lines WL and the plurality of bit lines BL cross each other.

The control logic 12 may write data to the memory cell array 11 or output various control signals for reading data from the memory cell array 11 based on a command CMD, an address ADDR, and a control signal CTRL received from the controller chip (410 of FIG. 11). The control logic 12 may generally control various operations in the memory chip.

Various control signals output from the control logic 12 may be provided to the voltage generator 13, the row decoder 14, and the page buffer 15. In detail, the control logic 12 may provide a voltage control signal CTRL_vol to the voltage generator 13, provide a row address X_ADDR to the row decoder 14, and provide a column address Y_ADDR to the page buffer 15.

The voltage generator 13 may generate, based on the voltage control signal CTRL_vol, various types of voltages for performing program, read, and/or erase operations on the memory cell array 11. In detail, the voltage generator 13 may generate a first driving voltage VWL for driving the plurality of word lines WL, a second driving voltage VSSL for driving the at least one string selection line SSL, and a third driving voltage VGSL for driving at least one ground selection line GSL The first driving voltage VWL may be a program voltage (or a write voltage), a read voltage, an erase voltage, a pass voltage, or a program verify voltage. In addition, the second driving voltage VSSL may be a string selection voltage, that is, an on-voltage or an off-voltage. In addition, the third driving voltage VGSL may be a ground selection voltage, that is, an on-voltage or an off-voltage.

The row decoder 14 may be connected to the memory cell array 11 through the plurality of word lines WL, and may activate some of the plurality of word lines WL in response to the row address X_ADDR received from the control logic 12. In detail, during a read operation, the row decoder 14 may apply a read voltage to a selected word line WL and apply a pass voltage to a non-selected word line WL.

During a program operation, the row decoder 14 may apply a program voltage to a selected word line WL and apply a pass voltage to a non-selected word line WL. The page buffer 15 may be connected to the memory cell array 11 through the plurality of bit lines BL. In detail, during a read operation, the page buffer 15 may operate as a sense amplifier to output data DATA stored in the memory cell array 11. During a program operation, the page buffer 15 may operate as a write driver to input the data DATA to be stored in the memory cell array 11.

FIGS. 14A, 14B, 15A, and 15B are diagrams illustrating a data storage method of memory chips forming the memory stacked chip 450 of FIG. 11.

In detail, FIGS. 14A, 14B, 15A, and 15B are provided to explain a data storage method of storing data in any one memory chip from among the memory chips 446a, 446b, 446c, 446d, 448a, and 448b forming the memory stacked chip (450 of FIG. 11). FIGS. 14A, 14B, 15A, and 15B are diagrams illustrating a distribution of a threshold voltage Vt according to the number of bits stored per memory chip in a memory chip to explain the data storage method.

Figure 17:
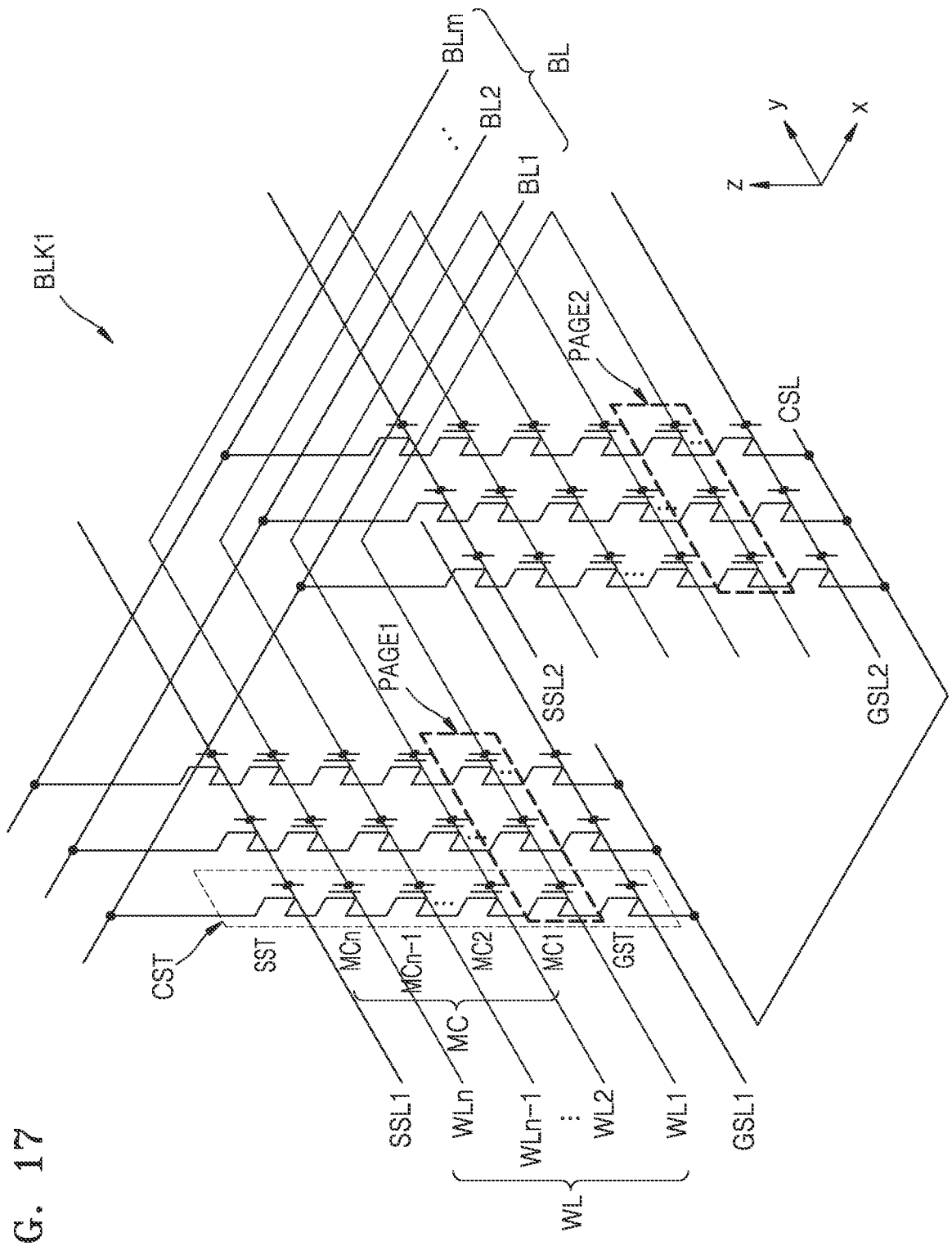
FIG. 17 is a circuit diagram illustrating a memory block included in the memory cell array shown in FIG. 16.

When an erase voltage is applied to the memory cell array 11 of FIG. 13, memory cells MC in FIG. 17 enter an erase state, and when a program voltage is applied to the memory cell array 11, the memory cells MC enter a program state. In this case, each memory cell MC may have one of an erase state E and first to n-th program states P1 to Pn, the erase state E and the first to n-th program states P1 to Pn being classified according to the threshold voltage Vt. Here, n may be a natural number of two or more.

Figure 14A:
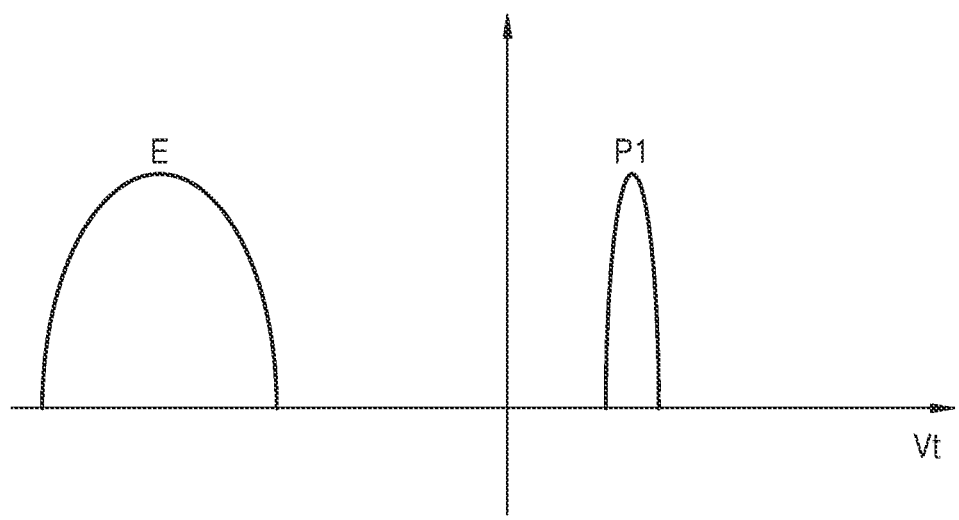
FIGS. 14A, 14B, 15A, and 15B are diagrams illustrating a data storage method of memory chips forming the memory stacked chip of FIG. 11.

For example, FIG. 14A illustrates a data storage method in which the SLC method is used, the SLC method storing one bit of data per memory cell. In the case of the SLC method, the threshold voltage Vt may be divided into the erase state E and a first program state P1.

Figure 14B:
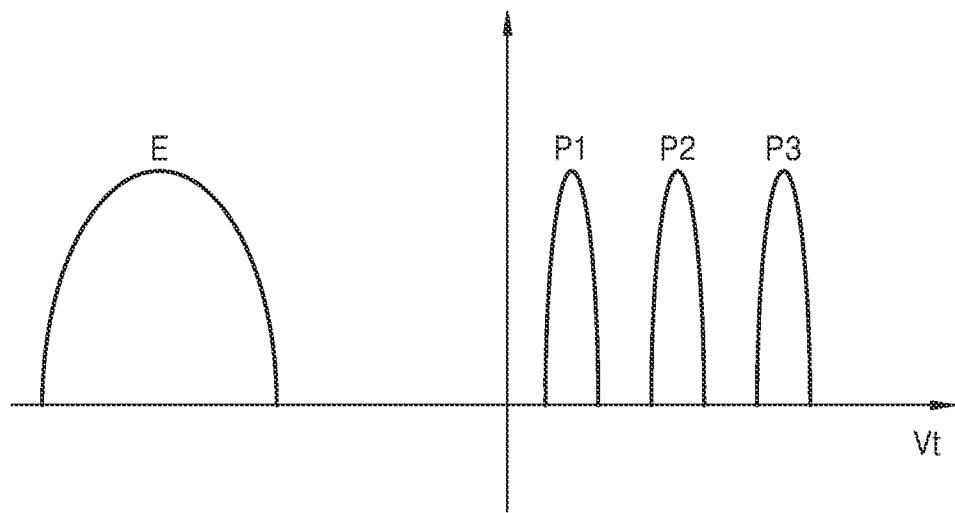

FIG. 14B illustrates a data storage method in which the MLC method is used, the MLC method storing two bits of data per memory cell. In the case of the MLC method, the threshold voltage Vt may be divided into the erase state E and first to third program states P1, P2, and P3.

Figure 15A:
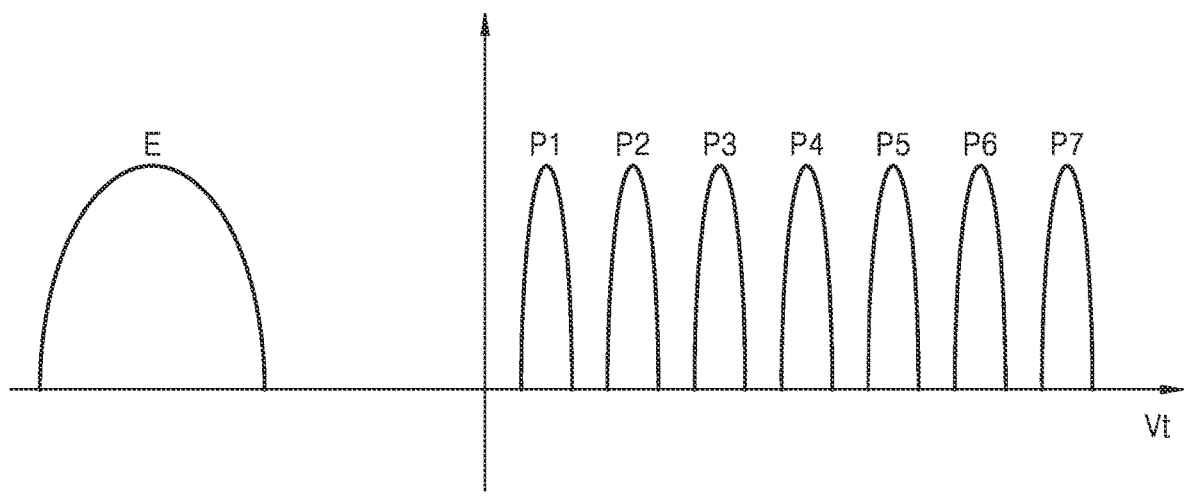

FIG. 15A illustrates a data storage method in which the TLC method is used, the TLC method storing three bits of data per memory cell. In the case of the TLC method, the threshold voltage Vt may be divided into the erase state E and first to seventh program states P1, P2, P3, P4, P5, P6, and P7.

Figure 15B:
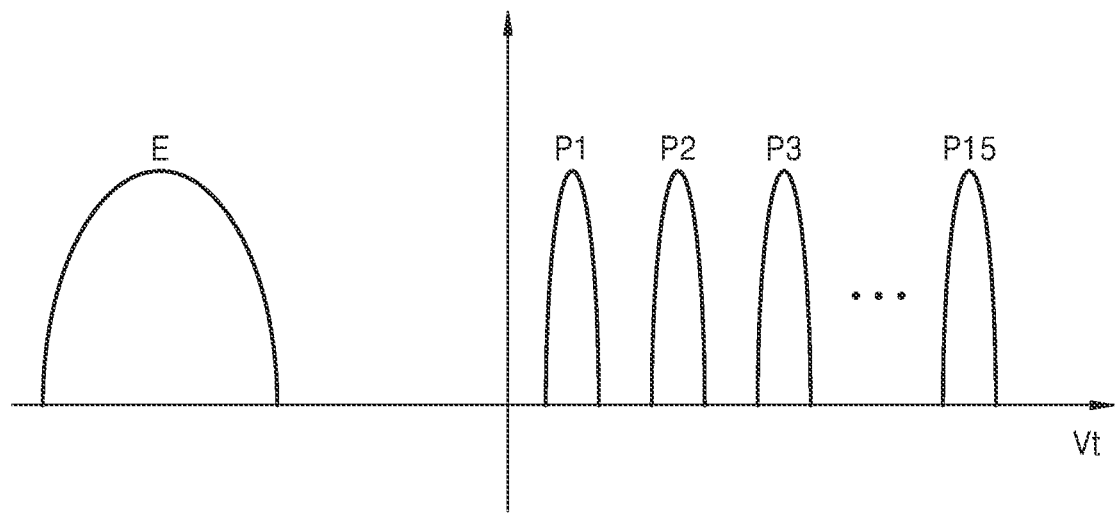

FIG. 15B illustrates a data storage method in which the QLC method is used, the QLC method storing four bits of data per memory cell. In the case of the QLC method, the threshold voltage Vt may be divided into the erase state E and first to fifteenth program states, P1 to P15.

As the number of bits stored per memory cell in a memory chip increases, the integration density and storage capacity of the memory chip may increase, but the endurance thereof, that is, the lifespan thereof, may be reduced. Therefore, a data storage method stored in a memory chip is determined by considering the storage capacity and the endurance of the memory chip together.

Figure 16:
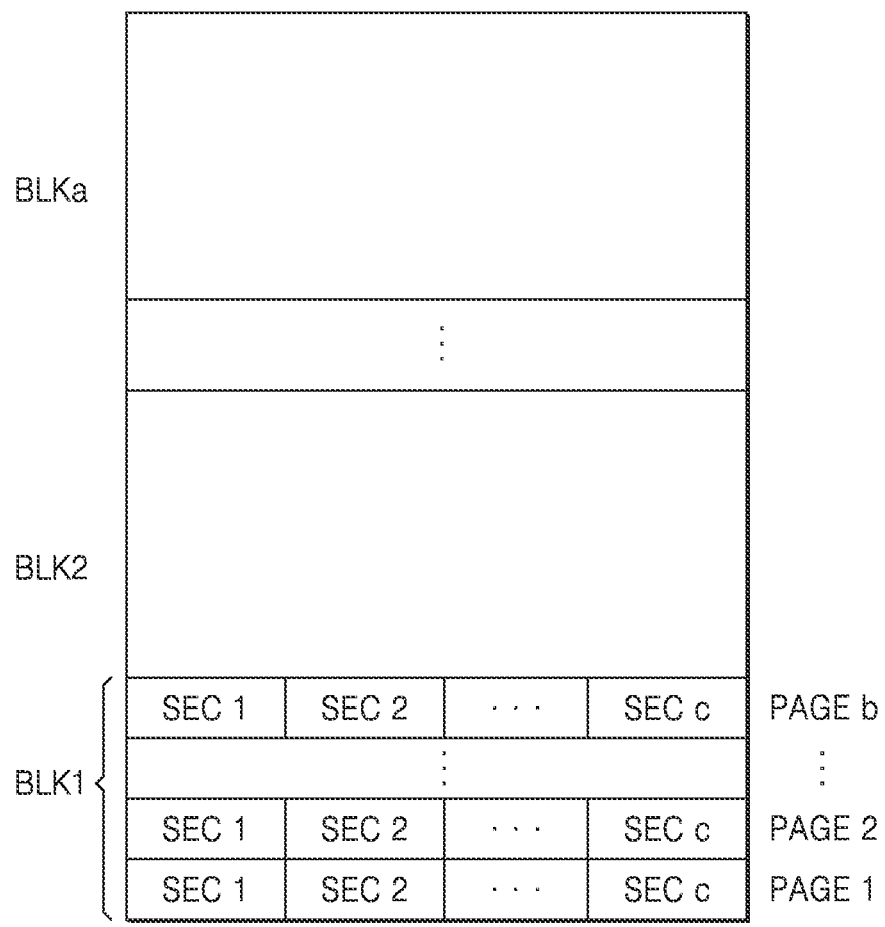
FIG. 16 is a diagram illustrating an example of a memory cell array shown in FIG. 13.

FIG. 16 is a diagram illustrating an example of the memory cell array 11 shown in FIG. 13.

In detail, the memory cell array 11 of FIG. 13 may include first to a-th (a is an integer of two or more) memory blocks BLK1 to BLKa, and each of the first to a-th memory blocks BLK1 to BLKa may include first to b-th (b is an integer of two or more) pages PAGE1 to PAGEb, and each of first to b-th pages PAGE1 to PAGEb may include first to c-th (c is an integer of two or more) sectors SEC1 to SECc.

For convenience of illustration, the first to b-th pages PAGE1 to PAGEb and the first to c-th sectors SEC1 to SECc are shown only in the first memory block BLK1 in FIG. 16, other memory blocks, for example, the second to a-th memory blocks BLK 2 to BLKa, may have the same or similar structure as that of the first memory block BLK1.

FIG. 17 is a circuit diagram illustrating a memory block included in the memory cell array 11 shown in FIG. 16.

In detail, FIG. 17 is a circuit diagram illustrating the first memory block BLK1 from among the first to a-th memory blocks BLK1 to BLKa of FIG. 16. The first memory block BLK1 may include a plurality of cell strings CST, a plurality of word lines WL, a plurality of bit lines BL, first and second ground selection lines GSL1 and GSL2, first and second string selection lines SSL1 and SSL2, and a common source line CSL.

Herein, the number of the plurality of cell strings CST, the number of the plurality of word lines WL, the number of the plurality of bit lines BL, the number of first and second ground selection lines GSL1 and GSL2, and the number of first and second string selection lines SSL1 and SSL2 may be variously changed according to some embodiments.

Each of the plurality of cell strings CST may include a string selection transistor SST connected in series between a corresponding bit line BL and the common source line CSL, a plurality of memory cells MC, and a ground selection transistor GST. The plurality of cell strings CST may extend in a third direction z, and in detail, the plurality of cell strings CST may extend in a vertical direction (z direction) on a substrate 710 of FIG. 18. Accordingly, the first memory block BLK1 including the plurality of cell strings CST may be referred to as a vertical NAND flash memory chip. As described above, the degree of integration of the memory cell array 11 may be improved by extending the plurality of cell strings CST on a substrate in the vertical direction z.

The plurality of word lines WL may extend in a first direction x and a second direction y, and each of the plurality of word lines WL may be connected to corresponding memory cells MC. Accordingly, the plurality of memory cells MC arranged adjacent to each other on the same layer in the first direction x and the second direction y may be connected to the same word line WL. In detail, each of the plurality of word lines WL may be connected to a gate of the memory cell MC and control the memory cell MC. In this case, the plurality of memory cells MC may store data, and may be programmed, read, and/or erased under the control of the connected word line WL.

The plurality of bit lines BL may extend in the first direction x, and may be connected to a plurality of string selection transistors SST. Accordingly, the plurality of string selection transistors SST arranged adjacent to each other in the first direction x may be connected to the same bit line BL. In detail, each of the plurality of bit lines BL may be connected to a drain of the string selection transistor SST.

The first and second string selection lines SSL1 and SSL2 may extend in the second direction y, and may be connected to the plurality of string selection transistors SST. Accordingly, the plurality of string selection transistors SST arranged adjacent to each other in the second direction y may be connected to the same string selection line, that is, the first or second string selection line SSL1 or SSL2. In detail, each of the first and second string selection lines SSL1 or SSL2 may be connected to a gate of the string selection transistor SST and control the string selection transistor SST.

The first and second ground selection lines GSL1 and GSL2 may extend in the second direction y, and may be connected to a plurality of ground selection transistors GST. Accordingly, the plurality of ground selection transistors GST arranged adjacent to each other in the second direction y may be connected to the same ground selection line, that is, the first or second ground selection line GSL1 or GSL2. In detail, each of first and second ground selection lines GSL1 or GSL2 may be connected to a gate of the ground selection transistor GST and control the ground selection transistor GST.

In addition, the plurality of ground selection transistors GST included in the plurality of cell strings CST may be commonly connected to the common source line CSL. In detail, the common source line CSL may be connected to a source of the ground selection transistor GST.

Here, the plurality of memory cells MC connected to the same word line WL and the same string selection line, that is, the first or second string selection line SSL1 or SSL2, and arranged adjacent to each other in the second direction y, may be referred to as a page PAGE. For example, the plurality of memory cells MC commonly connected to a first word lines WL1, commonly connected to the first string selection line SSL1, and arranged adjacent to each other in the second direction y may be referred to as the first page PAGE1. In addition, the plurality of memory cells MC commonly connected to the first word line, commonly connected to the second string selection line SSL2, and arranged adjacent to each other in the second direction y may be referred to as the second page PAGE2.

To perform a program operation on the memory cell MC, 0 V may be applied to the bit line BL, an on-voltage may be applied to a string selection line (i.e., the first or second string selection line SSL1 or SSL2), and an off-voltage may be applied to a ground selection line (i.e., the first or second ground selection line GSL1 or GSL2). The on-voltage may be greater than or equal to a threshold voltage to turn on the plurality of string selection transistors SST, and the off-voltage may be less than the threshold voltage to turn off the plurality of ground selection transistors GST. In addition, from among the plurality of memory cells MC, a program voltage may be applied to a selected memory cell MC, and a pass voltage may be applied to other memory cells MC. When the program voltage is applied, electric charges may be injected into the memory cells MC by F-N tunneling. The pass voltage may be greater than the threshold voltage of the plurality of memory cells MC.

To perform an erase operation on the plurality of memory cells MC, an erase voltage may be applied to a body of the plurality of memory cells MC and 0 V may be applied to the plurality of word lines WL. Accordingly, data of the plurality of memory cells MC may be erased at a time, i.e. concurrently.

Figure 18:
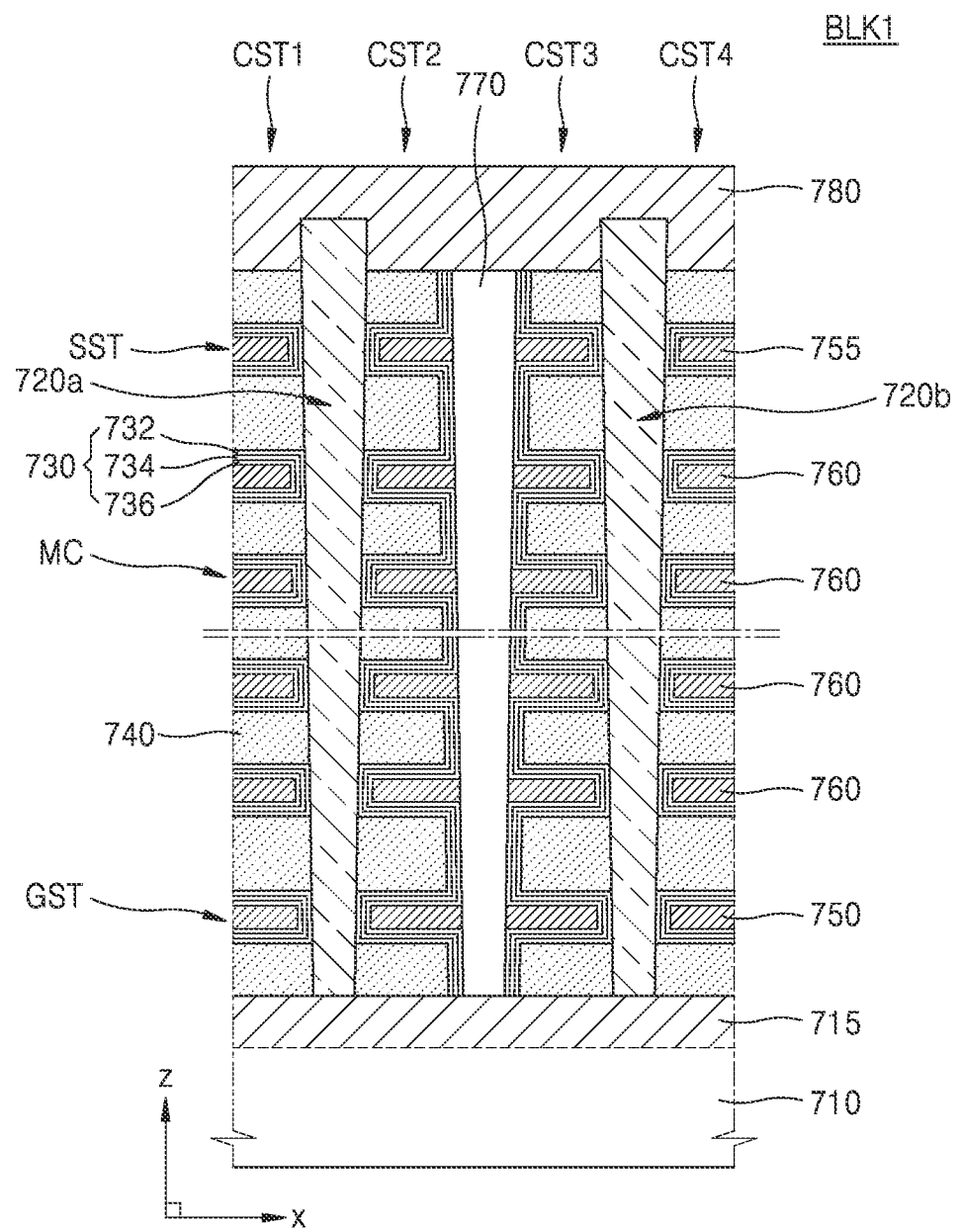
FIG. 18 is a cross-sectional view of a main part of a first memory block of FIG. 16 in a bit line direction.

FIG. 18 is a cross-sectional view of an essential portion of the first memory block BLK1 of FIG. 16 in a bit line direction.

In detail, the first memory block BLK1 may have a substrate 710 having a main surface extending in a first direction x. The substrate 710 may include a semiconductor material, for example, a Group IV semiconductor, a Group III-V compound semiconductor, or a Group II-VI oxide semiconductor. For example, the Group IV semiconductor may include silicon, germanium or silicon-germanium. In this case, the substrate 710 may be also provided as a bulk wafer or an epitaxial layer.

Semiconductor pillars 720a and 720b may be arranged on the substrate 710 to extend vertically onto the substrate 710. The semiconductor pillars 720a and 720b may include a semiconductor material such as polysilicon or single crystal silicon, and the semiconductor material may be undoped, or may include p-type or n-type impurities.

The substrate 710 may include an impurity region 715 below the semiconductor pillars 720a and 720b. The impurity region 715 may be a source region and may form a PN junction with other regions of the substrate 710. The common source line CSL of FIG. 17 may be connected to the impurity region 715. In some embodiments, different from the example of FIG. 18, the impurity region 715 may be limited to lower ends of the semiconductor pillars 720a and 720b.

Each of the plurality of memory cells MC may include a storage medium 730 on sidewalls of the semiconductor pillars 720a and 720b and a control gate electrode 760 on the storage medium 730. Each storage medium 730 may include a tunneling insulating layer 732 on the sidewalls of the semiconductor pillars 720a and 720b, a charge storage layer 734 on the tunneling insulating layer 732, and a blocking insulating layer 736 on the charge storage layer 734.

The charge storage layer 734 may have charge storage ability. For example, the charge storage layer 734 may be a trap type, and may include, for example, quantum dots or nanocrystals. The quantum dots or nanocrystals may include fine particles of a conductor, such as a metal or a semiconductor. The tunneling insulating layer 732 and the blocking insulating layer 736 may include an oxide film, a nitride film, or a high-k film. The high-k film may be referred to as a film having a higher dielectric constant than that of the oxide film and the nitride film.

The string selection transistor SST may include string selection electrodes 755 on the sidewalls of the semiconductor pillars 720a and 720b. The string selection transistor SST may be connected to a bit line 780. The bit line 780 may be formed in a line-shaped pattern extending in the first direction x. The ground selection transistor GST may include the ground selection gate electrodes 750 on the sidewalls of the semiconductor pillars 720a and 720b.

The storage medium 730 between the string selection transistor SST and the semiconductor pillars 720a and 720b, and the storage medium 730 between the ground selection transistor GST and the semiconductor pillars 720a and 720b may function as a gate insulating layer, and accordingly, may be replaced by a single insulating layer. Interlayer insulating layers 740 may be between the ground selection ground electrodes 750, the control gate electrodes 760, and the string selection gate electrodes 755. The storage medium 730 may extend along surfaces of the interlayer insulating layers 740.

First and second cell strings CST1 and CST2 may be arranged adjacent to each other with the semiconductor pillar 720a therebetween, and third and fourth cell strings CST3 and CST4 may be arranged adjacent to each other with the semiconductor pillar 720b therebetween. An insulating layer 770 may be arranged between the second cell string CST2 and the third cell string CST3.

The string selection gate electrode 755 may be connected to a string selection line (SSL1 or SSL2 of FIG. 17). The control gate electrodes 760 may be connected to word lines (WL1 to WLn of FIG. 17). The ground selection gate electrode 750 may be connected to a ground selection line (GSL1 or GSL2 of FIG. 17).

Figure 19:
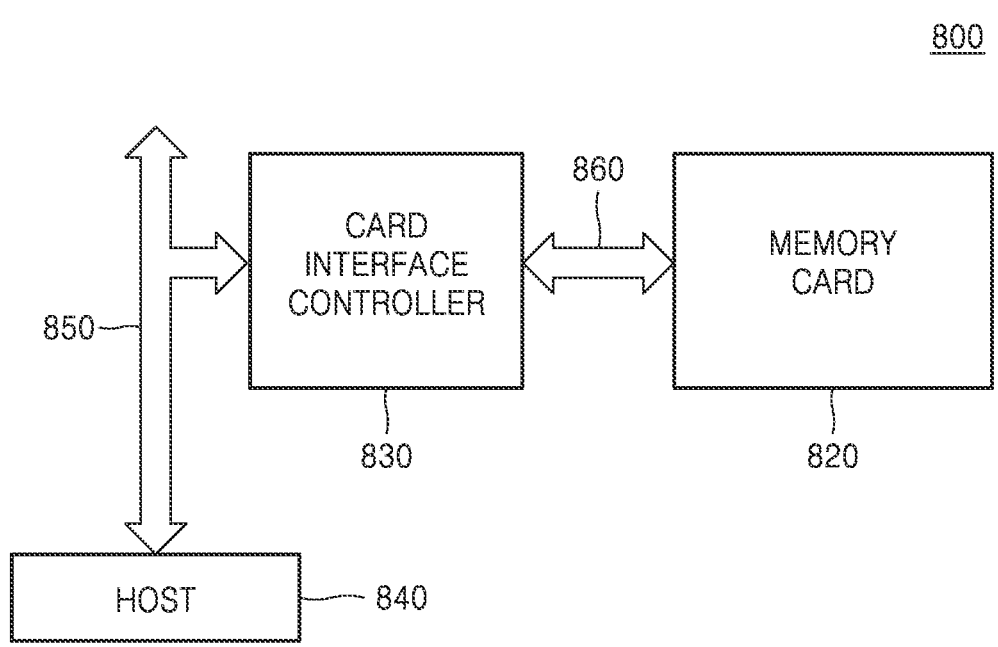
FIG. 19 is a diagram schematically illustrating a system using a memory card according to some embodiments of the inventive concept.

FIG. 19 is a diagram schematically illustrating a system 800 using a memory card 820 according to embodiments of the inventive concept.

In detail, the system 800 may include the memory card 820, a card interface controller 830, and a host (or an external device (apparatus)) 840. Components of the system 800 may be electrically connected through buses 850 and 860. The memory card 820 may correspond to the memory cards 100, 200, 300, and 400 described above.

The card interface controller 830 may control data exchange with the memory card 820. The card interface controller 830 may be used to store data in the memory card 820. The host 840 may control the card interface controller 830. The host 840 may control the memory card 820 through the card interface controller 830.

Figure 20:
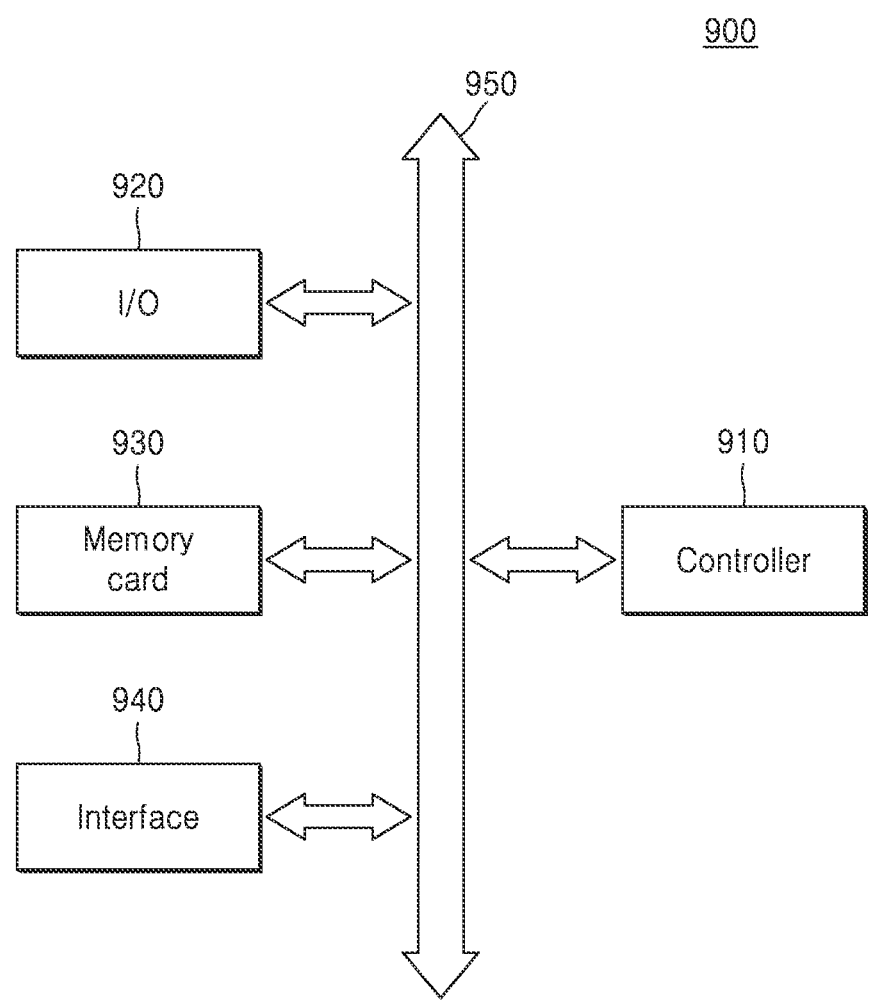
FIG. 20 is a block diagram illustrating an example of an electronic system including a memory card according to embodiments of the inventive concept.

FIG. 20 is a schematic block diagram illustrating an example of an electronic system 900 including a memory card 930 according to an embodiment of the inventive concept.

In detail, the electronic system 900 may include a controller 910, an I/O device 920, the memory card 930, an interface 940, and a bus 950. The controller 910, the I/O device 920, the memory card 930, and/or the interface 940 may be electrically connected to each other through the bus 950. The bus 950 corresponds to a path through which data is moved.

The controller 910 may include at least one of a microprocessor, a digital signal processor, a microcontroller, and/or logic devices which may perform functions similar thereto. The I/O device 920 may include a keypad, a keyboard, a display device, or the like.

The memory card 930 may store data and/or commands, or the like. The memory card 930 may correspond to the memory cards 100, 200, 300, and 400 described above. The interface 940 may transmit data to a communication network or receive data from the communication network.

The interface 940 may be wired or wireless. For example, the interface 940 may include an antenna or a wire/wireless transceiver, or the like. Although not illustrated in FIG. 20, the electronic system 900 may further include a high-speed dynamic random access memory (DRAM) device, and/or a static random access memory (SRAM) device, or the like as an operation memory device for improving an operation of the controller 910.

The electronic system 900 may be applied to a personal digital assistant (PDA), a portable computer, a web tablet, a wireless phone, a mobile phone, a digital music player, or an electronic product capable of transmitting and/or receiving data in a wireless environment.

While the inventive concept has been particularly shown and described with reference to embodiments thereof, it will be understood that various changes in form and details may be made therein without departing from the spirit and scope of the following claims.

What is claimed is:

1. A memory card comprising:
    an upper section;
    a lower section; and
    an integrated circuit package between the upper section and the lower section,
    wherein the integrated circuit package comprises:
    a stack of memory chips on a panel substrate, wherein the stack of memory chips comprises at least one base memory stacked chip and an additional one or more memory chips stacked on the at least one base memory stacked chip;
    a frequency boosting interface chip on the panel substrate and electrically connected to the stack of memory chips; and
    a controller chip on the panel substrate and electrically connected to the stack of memory chips and the frequency boosting interface chip.

2. The memory card of claim 1,
    wherein the stack of memory chips comprises a plurality of memory chips, and
    wherein a number of memory chips of the additional one or more memory chips is 0.5 times to 2 times a number of memory chips of the at least one base memory stacked chip.

3. The memory card of claim 1, wherein the at least one base memory stacked chip comprises two, four, or six memory chips.

4. The memory card of claim 1,
    wherein the stack of memory chips comprises a plurality of memory chips,
    wherein each of the plurality of memory chips comprises memory cells corresponding to a data storage method of a triple-level cell (TLC) method, and
    wherein the controller chip comprises a memory interface corresponding to a data storage method of a multiple-level cell (MLC) method or a single-level cell (SLC) method for the memory cells.

5. The memory card of claim 1,
    wherein the stack of memory chips comprises a plurality of memory chips,
    wherein each of the plurality of memory chips comprises memory cells corresponding to a data storage method of a quad-level cell (QLC) method, and
    wherein the controller chip comprises a memory interface corresponding to a data storage method of a multiple-level cell (MLC) method or a single-level cell (SLC) method for the memory cells.

6. The memory card of claim 1, wherein the controller chip is electrically connected to the stack of memory chips through the frequency boosting interface chip.

7. The memory card of claim 1,
    wherein the controller chip is electrically connected to the frequency boosting interface chip through one control channel,
    wherein the frequency boosting interface chip is electrically connected to the stack of memory chips through a plurality of memory channels, and
    wherein the plurality of memory channels are allocated for the one control channel.

8. The memory card of claim 1, wherein the stack of memory chips comprises a plurality of memory chips, and each of the plurality of memory chips comprises a corresponding vertical NAND flash memory chip.

9. A memory card comprising:
    a stack of memory chips on a panel substrate, wherein the stack of memory chips comprises at least one base memory stacked chip and an additional one or more memory chips stacked on the at least one base memory stacked chip;
    a frequency boosting interface chip on the panel substrate and electrically connected to the stack of memory chips; and
    a controller chip on the panel substrate and electrically connected to the stack of memory chips and the frequency boosting interface chip.

10. The memory card of claim 9,
wherein the at least one base memory stacked chip comprises two, four, or six memory chips, and
wherein a number of memory chips of the additional one or more memory chips is 0.5 times or 2 times of a number of memory chips of the at least one base memory stacked chip.

11. The memory card of claim 9,
wherein the stack of memory chips comprises a plurality of memory chips,
wherein each of the plurality of memory chips comprises memory cells corresponding to a data storage method of a triple-level cell (TLC) method, and
wherein the controller chip comprises a memory interface corresponding to a data storage method of a multiple-level cell (MLC) method or a single-level cell (SLC) method for the memory cells.

12. The memory card of claim 9,
wherein the controller chip is electrically connected to the frequency boosting interface chip through one control channel,
wherein the frequency boosting interface chip is electrically connected to the stack of memory chips through a plurality of memory channels, and
wherein the plurality of memory channels are allocated for the one control channel.

13. The memory card of claim 9,
wherein the frequency boosting interface chip is on the panel substrate and is spaced apart from the stack of memory chips, and
wherein the controller chip is on the panel substrate and is spaced apart from the stack of memory chips and the frequency boosting interface chip.

14. The memory card of claim 9, further comprising:
a molding layer that occupies spaces between the stack of memory chips, the frequency boosting interface chip, and/or the controller chip on the panel substrate.

15. A memory card comprising:
a stack of memory chips comprising a plurality of memory chips stacked on a panel substrate in a staircase shape, wherein ones of the plurality of memory chips adhere to each other by an adhesive layer, and wherein the stack of memory chips comprises at least one base memory stacked chip and an additional one or more memory chips on the at least one base memory stacked chip;
a first connection member that electrically connects the stack of memory chips to the panel substrate and electrically connects the plurality of memory chips to each other;
a frequency boosting interface chip on the panel substrate, wherein the frequency boosting interface chip is spaced apart from the stack of memory chips;
a second connection member that electrically connects the frequency boosting interface chip to the stack of memory chips;
a third connection member that electrically connects the frequency boosting interface chip to the panel substrate;
a controller chip on the panel substrate, wherein the controller chip is spaced apart from the frequency boosting interface chip; and
a fourth connection member that electrically connects the controller chip to the panel substrate.

16. The memory card of claim 15, wherein the adhesive layer comprises a base adhesive layer on the panel substrate, the memory card further comprising:
an inter-chip adhesive layer between adjacent ones of the plurality of memory chips,
wherein the controller chip is in the base adhesive layer.

17. The memory card of claim 15,
wherein the at least one base memory stacked chip comprises two, four, or six memory chips, and
wherein a number of memory chips of the additional one or more memory chips is 0.5 times or 2 times of a number of memory chips of the at least one base memory stacked chip.

18. The memory card of claim 15,
wherein each of the plurality of memory chips of the stack of memory chips comprises memory cells corresponding to a data storage method of a triple-level cell (TLC) method, and
wherein the controller chip comprises a memory interface corresponding to a data storage method of a multiple-level cell (MLC) method or a single-level cell (SLC) method for the memory cells.

19. The memory card of claim 15,
wherein the controller chip is electrically connected to the frequency boosting interface chip through one control channel,
wherein the frequency boosting interface chip is electrically connected to the stack of memory chips through a plurality of memory channels,
wherein the plurality of memory channels are allocated for the one control channel, and
wherein the frequency boosting interface chip of the memory card comprises a switching circuit member that electrically separates input/output ports of ones of the plurality of memory chips by connecting the input/output ports to respective ones of the plurality of memory channels.

* * * * *